United States Patent [19]

Soenen

[11] Patent Number: 5,615,228

[45] Date of Patent: Mar. 25, 1997

[54] APPARATUS AND METHOD TO DECODE A PULSE WIDTH MODULATED SERIAL DATA STREAM

[75] Inventor: Eric G. Soenen, Plano, Tex.

[73] Assignee: Texas Instruments Incorporated, Dallas, Tex.

[21] Appl. No.: 409,227

[22] Filed: Mar. 23, 1995

[51] Int. Cl.⁶ .................................................. H03K 7/08
[52] U.S. Cl. ................................... 375/238; 332/109
[58] Field of Search ................................ 375/238, 342; 379/9; 364/569; 329/312; 332/109

[56] References Cited

U.S. PATENT DOCUMENTS 4,982,350  1/1991  Perna et al. ........................ 364/569
5,313,496  5/1994  de Goede ............................ 375/346
5,414,347  5/1995  Monk et al. ....................... 324/73.1
5,436,853  7/1995  Shimohara ..................... 375/238 X Primary Examiner—Stephen Chin
Assistant Examiner—Kevin Kim
Attorney, Agent, or Firm—Robby T. Holland; Leo N. Heiting; Richard L. Donaldson

[57] ABSTRACT

An integrated circuit (IC) configurable as transmitter/receiver includes a microcontroller to aid in decoding a pulse width modulated serial dam stream. The microcontroller accomplishes the decoding with the aid of a counter and an external clock signal without the necessity of using interrupts. Edge detection circuitry detects the rising and the rising edge of the incoming data pulse. The external clock signal clocks a counter to determine how many clock signals the incoming pulse corresponds to. The microcontroller polls the counter on the rising edge and the falling edge.

3 Claims, 9 Drawing Sheets

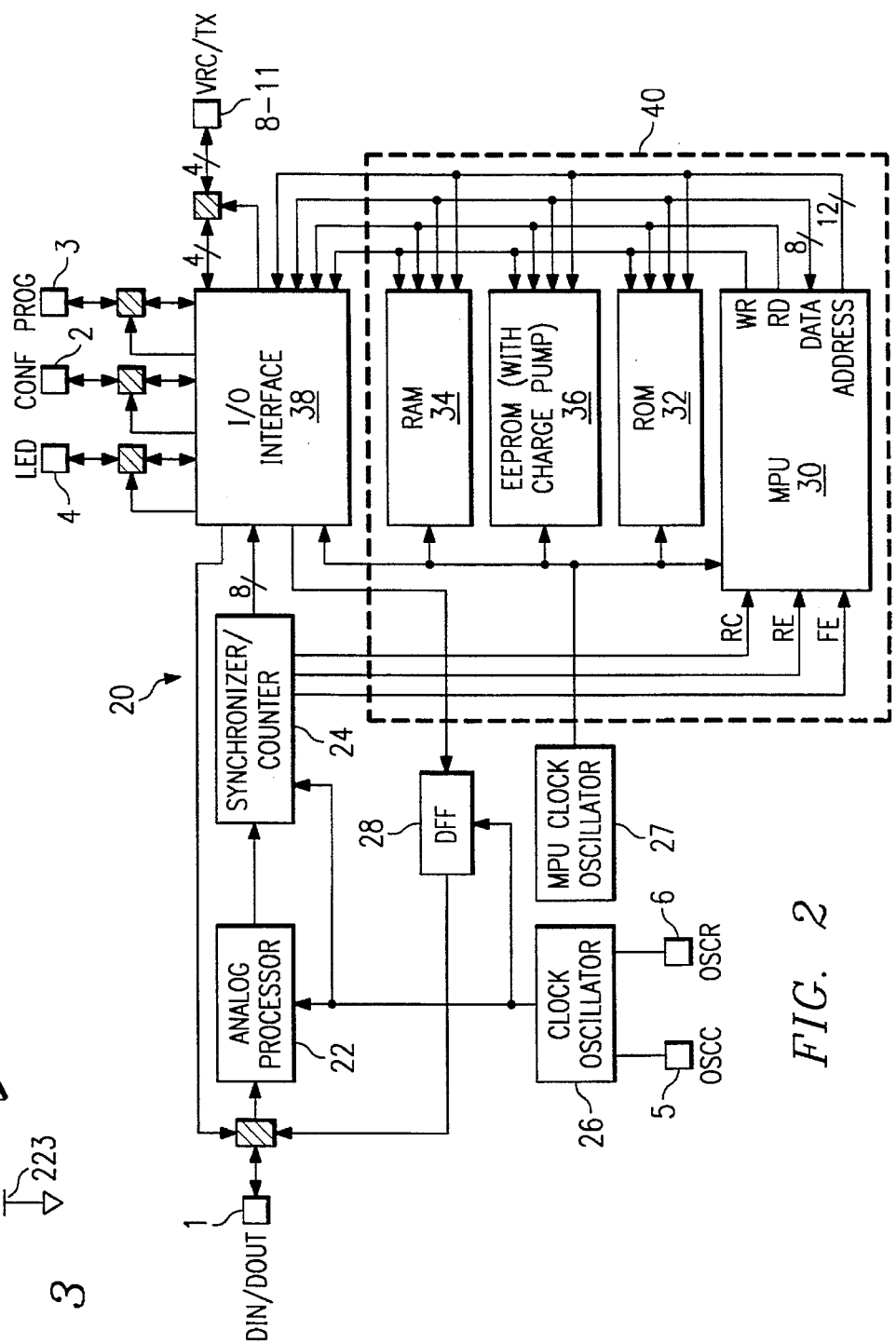
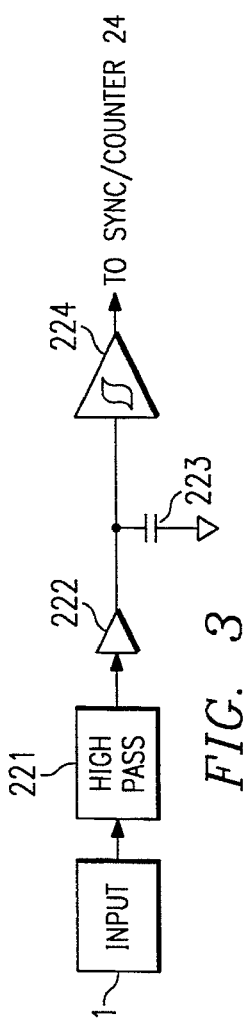
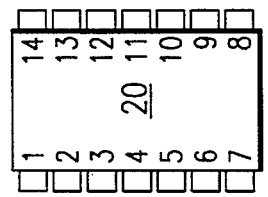

| BYTE 4 | BYTE 3 | BYTE 2 | BYTE 1 | BYTE 0 |
|---|---|---|---|---|
| S4 (8 BITS) | S3 (8 BITS) | S2 (8 BITS) | S1 (8 BITS) | S0 (8 BITS) |
MSB                        LSB
*FIG. 13*
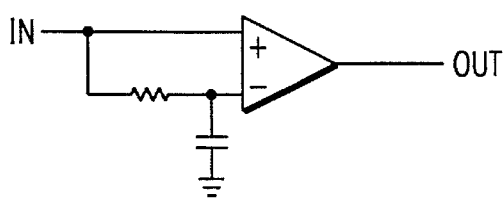
*FIG. 14*
*(PRIOR ART)*
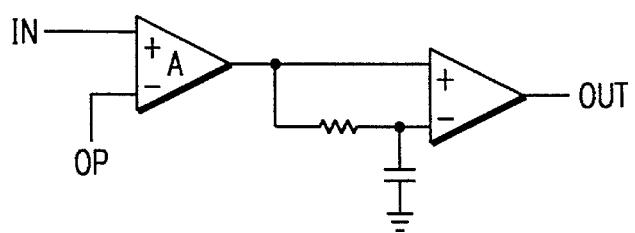
*FIG. 15*
*(PRIOR ART)*

APPARATUS AND METHOD TO DECODE A PULSE WIDTH MODULATED SERIAL DATA STREAM

CROSS REFERENCE TO RELATED APPLICATIONS

This application is related to the following coassigned applications filed on Jun. 15, 1994: TI-19359 bearing Ser. No. 08/260,148; TI-19360 bearing Ser. No. 08/259,819 now U.S. Pat. No. 5,471,668; TI-19363 bearing Ser. No. 08/259,803; and, TI-19365 bearing Ser. No. 08/259,820. This application is also related to the following coassigned applications filed simultaneously herewith: TI-19361 bearing Ser. No. 08/408,661; TI-19364 bearing Ser. No. 08/408,874; and, TI-20262 bearing Ser. No. 08/408,809.

FIELD OF INVENTION

This invention is in the field of data communications and more particularly relates to decoding a pulse width modulated serial data stream.

BACKGROUND OF INVENTION

Remote control or remote access systems use a transmitter and a receiver. An exemplary example is a garage door opener system where a transmitter is contained in a remote control unit and a receiver is connected to a garage door motor. The transmitter and receiver are typically comprised of different integrated circuits. When activated, the transmitter sends a serial data stream to the receiver by encoding the data and modulating it onto a radio frequency of infrared carrier.

Data encoding (on the transmitter side) into a pulse width modulated format is usually straight-forward. However, decoding (on the receiver side) can be a more complicated operation. Typically, the demodulated incoming signal must be analyzed by comparing the relative width of the incoming pulses, in order to determine which ones represent a logic 1 and which ones represent a logic 0. In addition, a "preamble" or synchronization sequence may be present. The decoding operation usually requires the measurement of high and low times within the waveform. The unit of time is usually determined by a data clock that is typically an external resistor/capacitor RC oscillator.

One convenient way to perform the decoding operation is to use a general-purpose microcontroller, on which the decoding method is implemented in software. However, in order to perform the operation real-time, the controller usually has to run very fast, or a complex structure of interrupts needs to be established. These are strong disadvantages in products where the controller must be kept small (for cost reasons) and running slow (for low power consumption).

it is accordingly an object of the invention to provide an apparatus having a microcontroller and method to decode a pulse-width modulated serial data stream.

Other objects and advantages of the invention will be apparanent to those of ordinary skill in the art having the benefit of the specification and drawings herein.

SUMMARY OF INVENTION

A pulse width modulated serial data stream is advantageously decoded using a microcontroller, a counter and an external clock signal. Edge detection circuitry detects the rising and the falling edge of the incoming data pulse. An external clock signal clocks a counter to determine how many clock signals the incoming pulse corresponds to. The microcontroller polls the counter on the rising edge and the falling edge and is free to perform other task otherwise without the necessity of using interrupts.

BRIEF DESCRIPTION OF DRAWINGS

FIG. 1 is a pin layout of an integrated circuit SMART device incorporating the invention.

FIG. 2 is an architectural block diagram of the integrated circuit device of FIG. 1.

FIG. 3 is a schematic diagram of the analog processor 22 of FIG. 2.

FIG. 13 is a drawing illustrating the 40 bit code divided into 5 bytes of 8 bits each.

FIG. 14 is a prior art drawing illustrating a self biasing comparator for signal shaping.

FIG. 15 is a prior art drawing illustrating an amplifier stage in front of a comparator for signal shaping.

DESCRIPTION OF APPENDICIES

Figure 6:
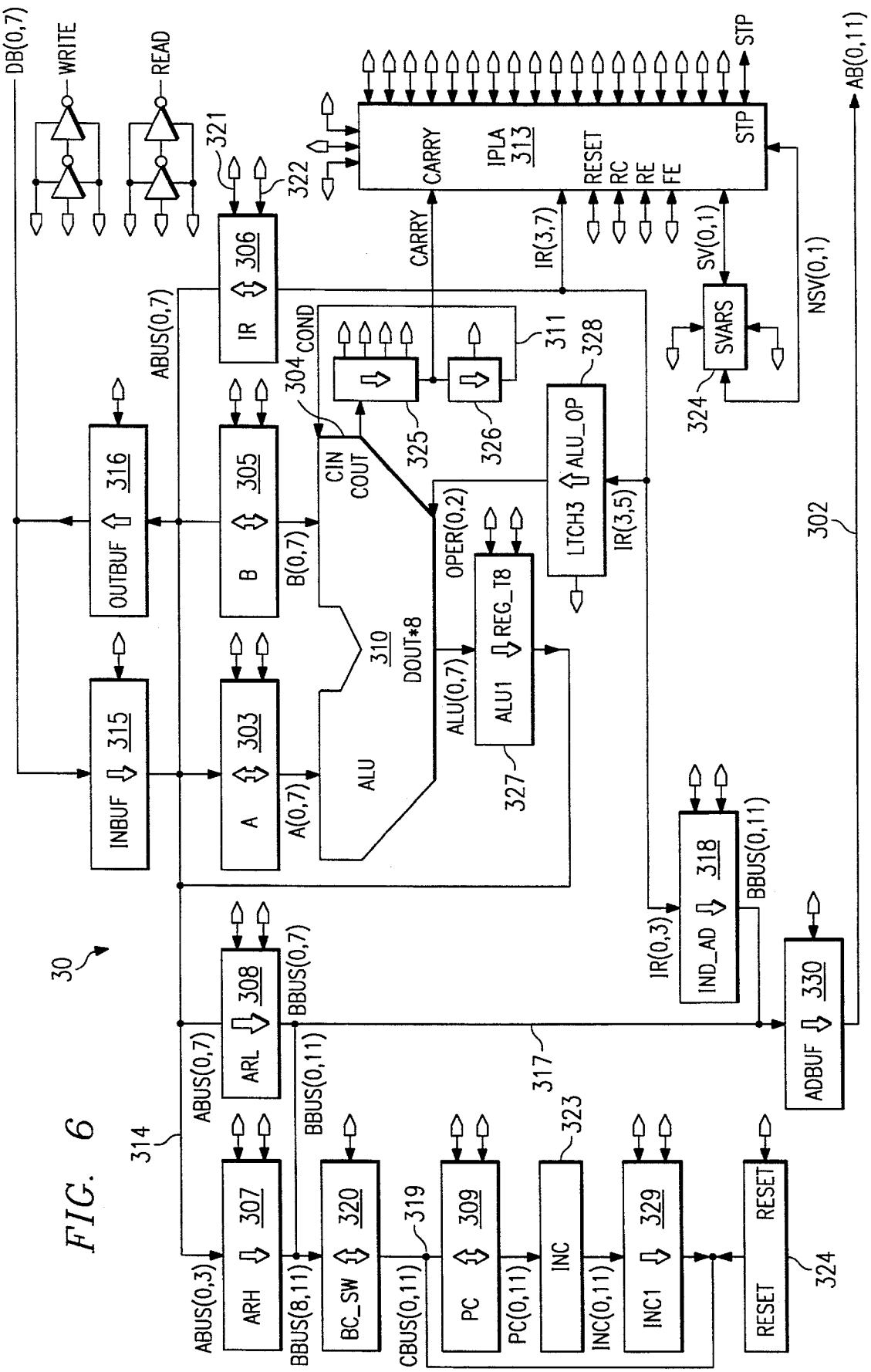
FIG. 6 is a block diagram an inventive processor core.

Appendix 1, pages 1–6, contains a listing of instructions for MPU 30 of FIG. 6.

Appendix 2, pages 1–3, contains an extended listing of the Instruction Programmable Logic Array 313 of MPU 30 of FIG. 6.

Appendix 3, page 1, contains a simplified listing of the Instruction Programmable Logic Array 313 of MPU 30 of FIG. 6.

Appendix 4, page 1, contains an illustration of the first ten encyrption outputs of the 1 trillion possible codes.

Appendix 5, pages 1–2 contain an encryption/decryption example.

Appendix 6, pages 1–6 contain the program used in the rolling code method.

APPENDIX 1.

INSTRUCTION SET
-----------------------

ALL STATES:

(1) eval IPLA
   (2) nsv -> sv
       ALU -> ALU1
   (3) prech IPLA
       INC -> INC1
       C -> C1

RESET CONDITION:

0  (1) 0 -> CBUS -> PC
      CBUS -> BBUS
  (2) read
      DB -> ABUS -> IR
      ABUS -> ARH
      0 -> C STP:
Stop and shut down clocks until POR or wake-up  ← DESCRIPTION
0000 0XXX  ← OP CODE
1 Byte, 1 Cycle  ← LENGTH
C: No change  ← Influence on CARRY 0  (1) INC1 -> CBUS -> PC
      CBUS -> BBUS
  (2) read
      DB -> ABUS -> IR
      ABUS -> ARH SHL:
Logic Shift Left on Accumulator
0000 1XXX
1 Byte, 1 Cycle
C -> bit 0, bit 7 -> C 0  (1) INC1 -> CBUS -> PC
      CBUS -> BBUS
  (2) read
      DB -> ABUS -> IR
      ABUS -> ARH
      COUT -> C
  (3) ALU1 -> ABUS -> A SHR:
Logic Shift Right on Accumulator
0001 0XXX
1 Byte, 1 Cycle
C -> bit 7, bit 0 -> C AND:
Logic AND B Register to Accumulator
0001 1XXX
1 Byte, 1 Cycle
If result = 00, C = 0, else C = 1

ORL:
Logic OR B Register to Accumulator
0010 0XXX
1 Byte, 1 Cycle
If result = 00, C = 0, else C = 1

XOR:
Logic EXOR B Register to Accumulator
0010 1XXX
1 Byte, 1 Cycle
If result = 00, C = 0, else C = 1

ADD:
Add B Register to Accumulator
0011 0XXX
1 Byte, 1 Cycle
C -> Carry In, Carry Out -> C SUB:
Subtract B Register from Accumulator
0011 1XXX
1 Byte, 1 Cycle
C -> Borrow In, Borrow Out -> C CLC:
Clear Condition Register
0100 0XXX
1 Byte, 1 Cycle
0 -> C

```
0   (1) INC1 -> CBUS -> PC
        CBUS -> BBUS
    (2) read
        DB -> ABUS -> IR
        ABUS -> ARH
        0 -> C
```

STC:
Set Condition Register
0100 1XXX
1 Byte, 1 Cycle
1 -> C

WRE:
Wait for Rising Edge (0->1 Transition) on Data Input
0101 0XXX
1 Byte, 1 Cycle Minimum
C: No change 0   (1) if RE
            INC1 -> CBUS -> PC
            CBUS -> BBUS
        else
            PC -> CBUS -> BBUS
    (2) read
            DB -> ABUS -> IR
            ABUS -> ARH WFE:
Wait for Falling Edge (1->0 Transition) on Data Input
0101 1XXX
1 Byte, 1 Cycle Minimum
C: No change WRC:
Wait for Rising Clock Edge (0->1 Transition)
0110 0XXX
1 Byte, 1 Cycle Minimum
C: No change LAV value:
Load Accumulator with Value, Immediate
0110 1XXX
2 Bytes, 2 Cycles
C: No change 0   (1) INC1 -> CBUS -> PC
        CBUS -> BBUS
    (2) read
        DB -> ABUS -> A 1   (1) INC1 -> CBUS -> PC
        CBUS -> BBUS
    (2) read
        DB -> ABUS -> IR
        ABUS -> ARH

```
LBA:
Load B Register from Accumulator
0111 0XXX
1 Byte, 1 Cycle
C: No change 0   (1) INC1 -> CBUS -> PC
        CBUS -> BBUS
    (2) read
        DB -> ABUS -> IR
        ABUS -> ARH
    (3) A -> ABUS -> B LDA address:
Load Accumulator from Memory, Direct
1000 AAAA
2 Bytes, 3 Cycles
C: No change 0   (1) INC1 -> CBUS -> PC
        CBUS -> BBUS
    (2) read
        DB -> ABUS -> ARL 1   (1) AR -> BBUS
    (2) read
        DB -> ABUS -> A 2   (1) INC1 -> CBUS -> PC
        CBUS -> BBUS
    (2) read
        DB -> ABUS -> IR
        ABUS -> ARH STA address:
Store Accumulator to Memory, Direct
1001 AAAA
2 Bytes, 3 Cycles
C: No change 0   (1) INC1 -> CBUS -> PC
        CBUS -> BBUS
    (2) read
        DB -> ABUS -> ARL 1   (1) AR -> BBUS
    (2) write
        A -> ABUS -> DB 2   (1) INC1 -> CBUS -> PC
        CBUS -> BBUS
    (2) read
        DB -> ABUS -> IR
        ABUS -> ARH
```

JMP address:
Jump to Absolute Address
1010 AAAA
2 Bytes, 2 Cycles
C: No change 0   (1) INC1 -> CBUS -> PC
        CBUS -> BBUS
    (2) read
        DB -> ABUS -> ARL 1   (1) AR -> BBUS
        BBUS -> CBUS -> PC
    (2) read
        DB -> ABUS -> IR
        ABUS -> ARH JPC:
Jump to Absolute Address when Condition Set
1011 AAAA
2 Bytes, 2 Cycles
C: No change 0   (1) INC1 -> CBUS -> PC
        CBUS -> BBUS
    (2) read
        DB -> ABUS -> ARL 1   (1) if C
            AR -> BBUS
            BBUS -> CBUS -> PC
        else
            INC1 -> CBUS -> PC
            CBUS -> BBUS
    (2) read
        DB -> ABUS -> IR
        ABUS -> ARH JNC:
Jump to Absolute Address when NOT Condition
1100 AAAA
2 Bytes, 2 Cycles
C: No change LAI address:
Load Accumulator from Memory, Indirect
1101 AAAA
1 Byte, 4 Cycles
C: No change 0   (1) al -> BBUS     (al = 800 hex + 2 * [lower 4 bits of IR])
    (2) read

```
        DB -> ABUS -> ARH 1   (1) a2 -> BBUS     (a2 = 800 hex + 2 * [lower 4 bits of IR] + 1)
    (2) read
        DB -> ABUS -> ARL 2   (1) AR -> BBUS
    (2) read
        DB -> ABUS -> A 3   (1) INC1 -> CBUS -> PC
        CBUS -> BBUS
    (2) read
        DB -> ABUS -> IR
        ABUS -> ARH
```

SAI address:
Store Accumulator to Memory, Indirect
1110 AAAA
1 Byte, 4 Cycles
C: No change

```
0   (1) a1 -> BBUS     (a1 = 800 hex + 2 * [lower 4 bits of IR])
    (2) read
        DB -> ABUS -> ARH 1   (1) a2 -> BBUS     (a2 = 800 hex + 2 * [lower 4 bits of IR] + 1)
    (2) read
        DB -> ABUS -> ARL 2   (1) AR -> BBUS
    (2) write
        A -> ABUS -> DB 3   (1) INC1 -> CBUS -> PC
        CBUS -> BBUS
    (2) read
        DB -> ABUS -> IR
        ABUS -> ARH
```

Appendix 2

Instruction PLA (extent?) — Output Control Signal

```
                                                       STATE
         INPUTS              OUTPUT CONTROL SIGNAL     VARIABLES

A A                I           A
                        B B A S C P N D A     A L        I
                        U U R H B C C B B A A A B U   I A
     I   S P   C     R  S S 2 O U 2 2 2 U B 2 B U 2     A 2
     N   T H   A     E  2 2 B R S C C A S U A U S A C S B B   N N
     S   A A   R     S  A A B T 2 B B B 2 S B S 2 B L E I B S S S
     T   T S   R R R F E R R U B P U U U D 2 U 2 I U R T T U T V V
     R   E E   Y C E E T H L S C C S S S B A S B R S C C O S P 0 1

RST  X 1      X X X X 1  0 0 0 1 1 0 0 0 0 0 0 0 0 0 0 0 0 0 0  0 0
       2                 1 0 0 0 0 0 0 1 0 0 0 0 1 0 1 0 0 0 0  0 0

STP  0 1      X X X X 0  0 0 0 1 1 0 1 0 0 0 0 0 0 0 0 0 0 0 0  0 0
       2                 1 0 0 0 0 0 0 1 0 0 0 0 1 0 1 0 0 0 1  0 0

SHL  0 1      X X X X 0  0 0 0 1 1 0 1 0 0 0 0 0 0 0 0 0 0 0 0  0 0
etc.   2                 1 0 0 0 0 0 0 1 0 0 0 0 1 0 1 1 0 0 0  0 0
       3                 0 0 0 0 0 0 0 0 0 0 0 0 0 1 0 0 0 0 0  0 0

CLC  0 1      X X X X 0  0 0 0 1 1 0 1 0 0 0 0 0 0 0 0 0 0 0 0  0 0
       2                 1 0 0 0 0 0 0 1 0 0 0 0 1 0 1 0 0 0 0  0 0

STC  0 1      X X X X 0  0 0 0 1 1 0 1 0 0 0 0 0 0 0 0 0 0 0 0  0 0
       2                 1 0 0 0 0 0 0 1 0 0 0 0 1 0 0 1 0 0 0  0 0

WRE  0 1      X X 1 X 0  0 0 0 1 1 0 1 0 0 0 0 0 0 0 0 0 0 0 0  0 0
     0 1      X X 0 X 0  0 0 0 1 0 1 0 0 0 0 0 0 0 0 0 0 0 0 0  0 0
       2                 1 0 0 0 0 0 0 1 0 0 0 0 1 0 0 0 0 0 0  0 0

WFE  0 1      X X X 1 0  0 0 0 1 1 0 1 0 0 0 0 0 0 0 0 0 0 0 0  0 0
     0 1      X X X 0 0  0 0 0 1 0 1 0 0 0 0 0 0 0 0 0 0 0 0 0  0 0
       2                 1 0 0 0 0 0 0 1 0 0 0 0 1 0 0 0 0 0 0  0 0

WRC  0 1      X 1 X X 0  0 0 0 1 1 0 1 0 0 0 0 0 0 0 0 0 0 0 0  0 0
     0 1      X 0 X X 0  0 0 0 1 0 1 0 0 0 0 0 0 0 0 0 0 0 0 0  0 0
       2                 1 0 0 0 0 0 0 1 0 0 0 0 1 0 0 0 0 0 0  0 0

LAV  0 1      X X X X 0  0 0 0 1 1 0 1 0 0 0 0 0 0 0 0 0 0 0 0  0 0
       2                 0 0 0 0 0 0 0 1 0 1 0 0 0 0 0 0 0 0 0  0 0

1 1      X X X X 0  0 0 0 1 1 0 1 0 0 0 0 0 0 0 0 0 0 0 0  0 0
       2                 1 0 0 0 0 0 0 1 0 0 0 0 1 0 0 0 0 0 0  0 0

LBA  0 1      X X X X 0  0 0 0 1 1 0 1 0 0 0 0 0 0 0 0 0 0 0 0  0 0
```

|     |     |         |                                     |     |
| --- | --- | ------- | ----------------------------------- | --- |
|     | 2   |         | 1 0 0 0 0 0 0 1 0 0 0 0 1 0 0 0 0 0 | 0 0 |
|     | 3   |         | 0 0 0 0 0 0 0 0 0 0 0 1 0 0 0 0 0 0 | 0 0 |
| LDA | 0 1 | X X X X 0 | 0 0 0 1 1 0 1 0 0 0 0 0 0 0 0 0 0 0 | 0 0 |
|     | 2   |         | 0 1 0 0 0 0 0 1 0 0 0 0 0 0 0 0 0 0 | 0 1 |
|     | 1 1 | X X X X 0 | 0 0 1 0 0 0 0 0 0 0 0 0 0 0 0 0 0 0 | 1 0 |
|     | 2   |         | 0 0 0 0 0 0 0 1 0 1 0 0 0 0 0 0 0 0 | 0 0 |
|     | 2 1 | X X X X 0 | 0 0 0 1 1 0 1 0 0 0 0 0 0 0 0 0 0 0 | 0 0 |
|     | 2   |         | 1 0 0 0 0 0 0 1 0 0 0 0 1 0 0 0 0 0 | 0 0 |
| STA | 0 1 | X X X X 0 | 0 0 0 1 1 0 1 0 0 0 0 0 0 0 0 0 0 0 | 0 1 |
|     | 2   |         | 0 1 0 0 0 0 0 1 0 0 0 0 0 0 0 0 0 0 | 0 0 |
|     | 1 1 | X X X X 0 | 0 0 1 0 0 0 0 0 0 0 0 0 0 0 0 0 0 0 | 1 0 |
|     | 2   |         | 0 0 0 0 0 0 0 1 0 1 0 0 0 0 0 0 0 0 | 0 0 |
|     | 2 1 | X X X X 0 | 0 0 0 1 1 0 1 0 0 0 0 0 0 0 0 0 0 0 | 0 0 |
|     | 2   |         | 1 0 0 0 0 0 0 1 0 0 0 0 1 0 0 0 0 0 | 0 0 |
| JMP | 0 1 | X X X X 0 | 0 0 0 1 1 0 1 0 0 0 0 0 0 0 0 0 0 0 | 0 1 |
|     | 2   |         | 0 1 0 0 0 0 0 1 0 0 0 0 0 0 0 0 0 0 | 0 0 |
|     | 1 1 | X X X X 0 | 0 0 1 1 1 0 0 0 0 0 0 0 0 0 0 0 0 0 | 0 0 |
|     | 2   |         | 1 0 0 0 0 0 0 1 0 0 0 0 1 0 0 0 0 0 | 0 0 |
| JPC | 0 1 | X X X X 0 | 0 0 0 1 1 0 1 0 0 0 0 0 0 0 0 0 0 0 | 0 1 |
|     | 2   |         | 0 1 0 0 0 0 0 1 0 0 0 0 0 0 0 0 0 0 | 0 0 |
|     | 1 1 | 1 X X X 0 | 0 0 1 1 1 0 0 0 0 0 0 0 0 0 0 0 0 0 | 0 0 |
|     | 1 1 | 0 X X X 0 | 0 0 0 1 1 0 1 0 0 0 0 0 0 0 0 0 0 0 | 0 0 |
|     | 2   |         | 1 0 0 0 0 0 0 1 0 0 0 0 1 0 0 0 0 0 | 0 0 |
| JNC | 0 1 | X X X X 0 | 0 0 0 1 1 0 1 0 0 0 0 0 0 0 0 0 0 0 | 0 1 |
|     | 2   |         | 0 1 0 0 0 0 0 1 0 0 0 0 0 0 0 0 0 0 | 0 0 |
|     | 1 1 | 0 X X X 0 | 0 0 1 1 1 0 0 0 0 0 0 0 0 0 0 0 0 0 | 0 0 |
|     | 1 1 | 1 X X X 0 | 0 0 0 1 1 0 1 0 0 0 0 0 0 0 0 0 0 0 | 0 0 |
|     | 2   |         | 1 0 0 0 0 0 0 1 0 0 0 0 1 0 0 0 0 0 | 0 0 |
| LAI | 0 1 | X X X X 0 | 0 0 0 0 0 0 0 0 0 0 0 0 0 0 0 0 1 0 | 0 1 |
|     | 2   |         | 1 0 0 0 0 0 0 1 0 0 0 0 0 0 0 0 0 0 | 0 0 |
|     | 1 1 | X X X X 0 | 0 0 0 0 0 0 0 0 0 0 0 0 0 0 0 1 1 0 | 1 0 |
|     | 2   |         | 0 1 0 0 0 0 0 1 0 0 0 0 0 0 0 0 0 0 | 0 0 |
|     | 2 1 | X X X X 0 | 0 0 1 0 0 0 0 0 0 0 0 0 0 0 0 0 0 0 | 1 1 |
|     | 2   |         | 0 0 0 0 0 0 0 1 0 1 0 0 0 0 0 0 0 0 | 0 0 |
|     | 3 1 | X X X X 0 | 0 0 0 1 1 0 1 0 0 0 0 0 0 0 0 0 0 0 | 0 0 |

|     |   |       |                                         |     |
|-----|---|-------|-----------------------------------------|-----|
|     | 2 |       | 1 0 0 0 0 0 0 1 0 0 0 0 1 0 0 0 0 0 0 0 | 0 0 |
| SAI | 0 1 | X X X X 0 | 0 0 0 0 0 0 0 0 0 0 0 0 0 0 0 0 0 0 1 0 | 0 1 |
|     | 2 |       | 1 0 0 0 0 0 0 1 0 0 0 0 0 0 0 0 0 0 0 0 | 0 0 |
|     | 1 1 | X X X X 0 | 0 0 0 0 0 0 0 0 0 0 0 0 0 0 0 0 0 1 1 0 | 1 0 |
|     | 2 |       | 0 1 0 0 0 0 0 1 0 0 0 0 0 0 0 0 0 0 0 0 | 0 0 |
|     | 2 1 | X X X X 0 | 0 0 1 0 0 0 0 0 0 0 0 0 0 0 0 0 0 0 0 0 | 1 1 |
|     | 2 |       | 0 0 0 0 0 0 0 0 1 0 1 0 0 0 0 0 0 0 0 0 | 0 0 |
|     | 3 1 | X X X X 0 | 0 0 0 1 1 0 1 0 0 0 0 0 0 0 0 0 0 0 0 0 | 0 0 |
|     | 2 |       | 1 0 0 0 0 0 0 1 0 0 0 0 1 0 0 0 0 0 0 0 | 0 0 |

Appendix 3
Instruction PLA (Simplified)

```
                                    OUTPUT CONTROL SIGNALS
     INPUTS                         ─────────────────────────────────              STATE VARIABLES

A A                 I             A
                         B B A S C P N D A       A L       I
                         U U R H B C C B A A A B U       I A
     I    S  P    C    R S S 2 O U 2 2 2 U B 2 B U 2    A 2
     N    T  H    A    E 2 2 B R S C C A S U A U S A C S B B   N N
     S    A  A    R    S A A B T 2 B B B 2 S B S 2 B L E I B S S S
     T    T  R  R R F  E R R U B P U U U D 2 U 2 I U R T T U T V V
     R    E  E  Y C E  T H L S C C S S S B A S B R S C C O S P 0 1

2 2 1 1 1 1 1 2 2 3 3 3 2 3 2 2 1 1 2

XXXXX  XX   X X X X 1  1 0 0 1 1 0 0 1 0 0 0 0 1 0 1 0 0 0 0   0 0
     00000  00   X X X X 0  1 0 0 1 1 0 1 1 0 0 0 0 1 0 1 0 0 0 1   0 0
     00XXX  00   X X X X 0  1 0 0 1 1 0 1 1 0 0 0 0 1 1 1 1 0 0 0   0 0
     01000  00   X X X X 0  1 0 0 1 1 0 1 1 0 0 0 0 1 0 1 0 0 0 0   0 0
     01001  00   X X X X 0  1 0 0 1 1 0 1 1 0 0 0 0 1 0 0 1 0 0 0   0 0
     01010  00   X X 1 X 0  1 0 0 1 1 0 1 1 0 0 0 0 1 0 0 0 0 0 0   0 0
     01010  00   X X 0 X 0  1 0 0 1 0 1 0 1 0 0 0 0 1 0 0 0 0 0 0   0 0
     01011  00   X X X 1 0  1 0 0 1 1 0 1 1 0 0 0 0 1 0 0 0 0 0 0   0 0
     01011  00   X X X 0 0  1 0 0 1 0 1 0 1 0 0 0 0 1 0 0 0 0 0 0   0 0
     01100  00   X 1 X X 0  1 0 0 1 1 0 1 1 0 0 0 0 1 0 0 0 0 0 0   0 0
     01100  00   X 0 X X 0  1 0 0 1 0 1 0 1 0 0 0 0 1 0 0 0 0 0 0   0 0
     01101  00   X X X X 0  0 0 0 1 1 0 1 1 0 1 0 0 0 0 0 0 0 0 0   0 1
     01101  01   X X X X 0  1 0 0 1 1 0 1 1 0 0 0 0 1 0 0 0 0 0 0   0 0
     01110  00   X X X X 0  1 0 0 1 1 0 1 1 0 0 1 1 0 0 0 0 0 0 0   0 0
     1000X  00   X X X X 0  0 1 0 1 1 0 1 1 0 0 0 0 0 0 0 0 0 0 0   0 1
     1000X  01   X X X X 0  0 0 1 0 0 0 0 1 0 1 0 0 0 0 0 0 0 0 0   1 0
     1000X  10   X X X X 0  1 0 0 1 1 0 1 1 0 0 0 0 1 0 0 0 0 0 0   0 0
     1001X  00   X X X X 0  0 1 0 1 1 0 1 1 0 0 0 0 0 0 0 0 0 0 0   0 1
     1001X  01   X X X X 0  0 0 1 0 0 0 0 1 0 1 0 0 0 0 0 0 0 0 0   1 0
     1001X  10   X X X X 0  1 0 0 1 1 0 1 1 0 0 0 0 1 0 0 0 0 0 0   0 0
     1010X  00   X X X X 0  0 1 0 1 1 0 1 1 0 0 0 0 0 0 0 0 0 0 0   0 1
     1010X  01   X X X X 0  1 0 1 1 1 0 0 1 0 0 0 0 1 0 0 0 0 0 0   0 0
     1011X  00   X X X X 0  0 1 0 1 1 0 1 1 0 0 0 0 0 0 0 0 0 0 0   0 1
     1011X  01   1 X X X 0  1 0 1 1 1 0 0 1 0 0 0 0 1 0 0 0 0 0 0   0 0
     1011X  01   0 X X X 0  1 0 0 1 1 0 1 1 0 0 0 0 1 0 0 0 0 0 0   0 0
     1100X  00   X X X X 0  0 1 0 1 1 0 1 1 0 0 0 0 0 0 0 0 0 0 0   0 1
     1100X  01   0 X X X 0  1 0 1 1 1 0 0 1 0 0 0 0 1 0 0 0 0 0 0   0 0
     1100X  01   1 X X X 0  1 0 0 1 1 0 1 1 0 0 0 0 1 0 0 0 0 0 0   0 0
     1101X  00   X X X X 0  1 0 0 0 0 0 0 1 0 0 0 0 0 0 0 0 0 1 0   0 1
     1101X  01   X X X X 0  0 1 0 0 0 0 0 1 0 0 0 0 0 0 0 0 1 1 0   1 0
     1101X  10   X X X X 0  0 0 1 0 0 0 0 1 0 1 0 0 0 0 0 0 0 0 0   1 1
     1101X  11   X X X X 0  1 0 0 1 1 0 1 1 0 0 0 0 1 0 0 0 0 0 0   0 0
     1110X  00   X X X X 0  1 0 0 0 0 0 0 1 0 0 0 0 0 0 0 0 0 1 0   0 1
     1110X  01   X X X X 0  0 1 0 0 0 0 0 1 0 0 0 0 0 0 0 0 1 1 0   1 0
     1110X  10   X X X X 0  0 0 1 0 0 0 0 1 0 1 0 0 0 0 0 0 0 0 0   1 1
     1110X  11   X X X X 0  1 0 0 1 1 0 1 1 0 0 0 1 0 0 0 0 0 0 0   0 0
```

APPENDIX 4

| Security Code Bytes | | | | |
|---|---|---|---|---|
| $S_4$ | $S_3$ | $S_2$ | $S_1$ | $S_0$ |
| 00000000 | 00000000 | 00000000 | 00000000 | 00000000 |
| 00000000 | 00000000 | 00000000 | 00000000 | 00000001 |
| 00000000 | 00000000 | 00000000 | 00000000 | 00000010 |
| 00000000 | 00000000 | 00000000 | 00000000 | 00000011 |
| 00000000 | 00000000 | 00000000 | 00000000 | 00000100 |
| 00000000 | 00000000 | 00000000 | 00000000 | 00000101 |
| 00000000 | 00000000 | 00000000 | 00000000 | 00000110 |
| 00000000 | 00000000 | 00000000 | 00000000 | 00000111 |
| 00000000 | 00000000 | 00000000 | 00000000 | 00001000 |
| 00000000 | 00000000 | 00000000 | 00000000 | 00001001 |

| Encrypted Security Code Bytes | | | | |
|---|---|---|---|---|
| $E_4$ | $E_3$ | $E_2$ | $E_1$ | $E_0$ |
| 00000000 | 00000000 | 00000000 | 00000000 | 00000000 |
| 00000001 | 00000001 | 00000001 | 00000001 | 00000001 |
| 00000010 | 00000010 | 00000010 | 00000010 | 00000010 |
| 00000011 | 00000011 | 00000011 | 00000011 | 00000011 |
| 00000100 | 00000100 | 00000100 | 00000100 | 00000100 |
| 00000101 | 00000101 | 00000101 | 00000101 | 00000101 |
| 00000110 | 00000110 | 00000110 | 00000110 | 00000110 |
| 00000111 | 00000111 | 00000111 | 00000111 | 00000111 |
| 00001000 | 00001000 | 00001000 | 00001000 | 00001000 |
| 00001001 | 00001001 | 00001001 | 00001001 | 00001001 |

APPENDIX 5

```
MARCSTAR ENCRYPTION / DECRYPTION EXAMPLE
-----------------------------------------
Byte:      4        3        2        1        0

S:    11101001 00100001 00010010 01010010 00101110
E:    10100110 01001111 01101110 01111100 00101110

S:    11101001 00100001 00010010 01010010 00101111
E:    10100111 01001110 01101111 01111101 00101111

S:    11101001 00100001 00010010 01010010 00110000
E:    10111000 01010001 01110000 01100010 00110000

S:    11101001 00100001 00010010 01010010 00110001
E:    10111001 01010000 01110001 01100011 00110001

S:    11101001 00100001 00010010 01010010 00110010
E:    10111010 01010011 01110010 01100000 00110010

S:    11101001 00100001 00010010 01010010 00110011
E:    10111011 01010010 01110011 01100001 00110011

S:    11101001 00100001 00010010 01010010 00110100
E:    10111100 01010101 01110100 01100110 00110100

S:    11101001 00100001 00010010 01010010 00110101
E:    10111101 01010100 01110101 01100111 00110101

S:    11101001 00100001 00010010 01010010 00110110
E:    10111110 01010111 01110110 01100100 00110110

S:    11101001 00100001 00010010 01010010 00110111
E:    10111111 01010110 01110111 01100101 00110111

S:    11101001 00100001 00010010 01010010 00111000
E:    10110000 01011001 01111000 01101010 00111000

S:    11101001 00100001 00010010 01010010 00111001
E:    10110001 01011000 01111001 01101011 00111001

S:    11101001 00100001 00010010 01010010 00111010
E:    10110010 01011011 01111010 01101000 00111010

S:    11101001 00100001 00010010 01010010 00111011
E:    10110011 01011010 01111011 01101001 00111011

S:    11101001 00100001 00010010 01010010 00111100
E:    10110100 01011101 01111100 01101110 00111100

S:    11101001 00100001 00010010 01010010 00111101
E:    10110101 01011100 01111101 01101111 00111101

S:    11101001 00100001 00010010 01010010 00111110
E:    10110110 01011111 01111110 01101100 00111110

S:    11101001 00100001 00010010 01010010 00111111
E:    10110111 01011110 01111111 01101101 00111111
```

```
S:  11101001 00100001 00010010 01010010 01000000
E:  11001000 00100001 00000000 00010010 01000000

S:  11101001 00100001 00010010 01010010 01000001
E:  11001001 00100000 00000001 00010011 01000001
```

APPENDIX 6

```
;*****************************************
;DOWN LOAD DATA (S0-S4) TO THE RAM
;*****************************************
;Get the most current data from the EEPROM
;and store it in the location decided by PTROLD.

LDA PTROLD
        SHL         ;(*2)
        LBA
        SHL         ;(*4)
        ADD
        STA PEEL    ;(*2 + *4)

LAV 04
        STA CNT4

;download the stored data in EEPROM to the RAM.
eeram   LAI PEEH
        SAI PRAMH LAV 01
        LBA
        LDA PRAML
        ADD
        STA PRAML   ;increment RAM ptr to next byte LDA PEEL
        ADD
        STA PEEL    ;increment EE ptr to next byte LDA CNT4
        SUB
        STA CNT4    ;Loop 4X
        JNC eeram CLC
        LAV 04
        STA PRAML   ;Set RAM ptr to the beginning - LSB
;*****************************
;end of eeram.
;*****************************

;***********************************************************
;INCREMENT THE DATA (S0-S4) IN RAM BY 1.
;STORE THE INCREMENTED DATA BACK IN THE EEPROM.
;***********************************************************
;Increment the data now in RAM by 1 and store back in EEPROM.
;Use PTROLD to place the data in the correct location in EEPROM.
        LDA PTROLD
        SHL         ;(*2)
        LBA
        SHL         ;(*4)
        ADD
        STA PEEL    ;(*2 + *4)

;Increment the data in RAM and store back in the EEPROM.
incrst  LAV 01      ;increment the bank by 1 and store
        LBA
        CLC
```

```
        LAV 08
        STA PRAMH
        LAV 04
        STA PRAML    ;reset bit counter for next bank of data

LDA BYTE1
        ADD
        STA BYTE1    ;S0
        SAI PEEH

LAV 00
        LBA
        SHL
        STA RESULT   ;Save the Carry.

LAV 01
        LBA

LDA PEEL
        ADD          ;PEEL to next address and store.
        STA PEEL

LDA PRAML
        ADD          ;PEEL to next address and store.
        STA PRAML

LAV 03
        STA CNT incgo   LDA RESULT   ;increment and go. Add in the Carry.
        LBA
        LAI PRAMH
        ADD
        SAI PRAMH    ;S1 THRU S4
        SAI PEEH

LAV 00
        LBA
        SHL
        STA RESULT

LAV 01
        LBA

LDA PEEL
        ADD          ;PEEL to next address and store.
        STA PEEL

LDA PRAML
        ADD          ;PEEL to next address and store.
        STA PRAML LDA CNT
        SUB
        STA CNT
        JNC incgo ;********************************
;end of increment and store.
;********************************
```

```
;*********************************:   ********************
;ENCRYPT THE DATA (S0-S4) STORED IN RAM TO GENERATE (E0-E4).
;***************************************************************

;Encryption Routine
encrypt LAV 08
        STA PRAMH
        LAV 04
        STA PRAML

LAV 03
        STA CNT4

LAI PRAMH   ;S0
        STA RESULT  ;E0=S0
        LAV 01
        LBA
;increment RAM ptr.
        LDA PRAML
        ADD
        STA PRAML encrpt  LAI PRAMH   ;E0 THRU E4
        LBA
        LDA RESULT
        XOR
        STA RESULT  ;E1 THRU E4
        SAI PRAMH
        CLC ;increment RAM ptr.
        LAV 01
        LBA
        LDA PRAML
        ADD
        STA PRAML ;decrement Loop count
        LDA CNT4
        SUB
        STA CNT4
        JNC encrpt ;**********************************
; end of Encryption Routine.
;**********************************

****************************************************************
; DECRYPTING THE ENCRYPTED DATA (E0-E4) GENERATES (S0-S4)
****************************************************************

;Decryption Routine
decrypt CLC

LDA BYTE2   ;E1
        LBA
        LDA BYTE1   ;E0 AND S0
        XOR
        STA BYTE2   ;S1
```

```
        LDA BYTE3    ;E2
        XOR
        STA RESULT1  ;S2
        LDA BYTE4    ;E3
        LBA
        LDA BYTE3
        XOR
        STA RESULT2  ;S3

LDA BYTE5    ;E4
        XOR
        STA BYTE5    ;S4

LDA RESULT1
        STA BYTE3    ;S2
        LDA RESULT2
        STA BYTE4    ;S3

;*****************************************************
;end of Decryption Routine.
;*****************************************************

;*****************************************************
;CHECK THE DATA IN THE EEPROM AGAINST THE DATA IN THE
;RAM. VERIFY THEY ARE WITHIN 256 OF EACH OTHER.
;***************************************************** chmatch CLC          ;CHECK EEPROM
        LAV 0A       ;initialize EE location
        STA PEEH
        LAV 00
        STA PEEL ; subtract EE bank from the RAM bank   (RAM-EEPROM-1)
; During the Learn Mode, if data is not within 256 then store it.
; Check all four EE banks locations.

LAV 03
        STA CNT4     ; Code (bank) counter

LAV 00
        STA FLAGC    ; Keeps track of codes (to match)

codloop LAV 04       ; code loop each code has 5 bytes.
        STA CNT      ; Byte counter LAV 00       ; initialize
        STA FLAG     ; Keep track of which bits are 0

LAV 01       ; First time around, set carry
        STA RESULT

LAV 08       ; initialize RAM pointer
        STA PRAMH
        LAV 04
        STA PRAML bytloop LDA RESULT   ; Get carry back
```

```
        SHR         ; shift in carry
;Save Carry in RESULT and save the number in RESULT1.
;If Result is zero the byte matches.

LAI PEEH    ; Subtract two bytes
        LBA
        LAI PRAMH
        SUB
        STA RESULT1 ; store temporarily LAV 00      ; Save carry in RESULT
        LBA
        SHL
        STA RESULT LDA RESULT1 ; Check if byte is zero and save in flag
        XOR         ; set carry if not equal (RESULT1 not = 00).
        LDA FLAG
        SHL
        STA FLAG    ; moves new carry bit into FLAG LAV 01      ; Advance pointers to RAM and EE
        LBA
        LDA PEEL
        ADD
        STA PEEL

LDA PRAML
        ADD
        STA PRAML

LDA CNT     ; Decrement counter
        SUB
        STA CNT
        JNC bytloop
        CLC ; FLAG now contains 5 bits that are either 1 or 0(match)
        LAV OF      ; 0000 1111 ;don't care about LSB location 0804
        LBA         ;   LSB MSB
        LDA FLAG    ; Keep only bits corresponding to bytes 2-5
        AND
        CLC
        LBA
        LAV 00      ; Check whether bytes 2-5 were 0
        XOR         ; Carry = 0 if match occurred (4 MS bytes 0)

;FLAGC checks the four EE banks. A zero bit means there was
;a match between the new data and the EE LDA FLAGC
        SHL
        STA FLAGC   ; Store code FLAGC LAV 01      ;INCREMENT BEYOND CHECK
        LBA         ;SUM BYTE
        LDA PEEL
        ADD
        STA PEEL
```

```
        LDA CNT4    ; Decrement counter
        SUB
        STA CNT4
        JNC codloop ;Done 4X to check all 4 banks.
        CLC ;*****************************************************
;end of chmatch routine.
;*****************************************************
```

DETAILED DESCRIPTION OF PREFERRED EMBODIMENT

FIG. 1 is a drawing illustrating a pin layout of an integrated circuit 20 incorporating the invention. As will be explained later in detail, integrated circuit 20 contains circuitry that advantageously allows it to perform as a transmitter and as a receiver. It additionally includes learn capability. Integrated circuit 20 has 14 pins and may be packaged in a dual in-line plastic and small outline surface-mount package. Table 1 provides a description of the pins. A discussion of selected pins thereafter follows.

TABLE 1

| PIN | N | I/O | DESCRIPTION |
|---|---|---|---|
| DIN/ DOUT | 1 | I/O | Serial data input/output. In the receive mode, DIN/DOUT becomes an input to receive saw data from up to four transmitters. In the learn mode, DIN/DOUT becomes an input to learn code from up to four transmitters. In the transmit mode, DIN/DOUT becomes an output for the transmitted data. DIN/DOUT is active high and clocked by the internal variable oscillator. |
| CONF | 2 | I | Device configuration bit. When set to a logic high logic level, the device assumes the transmitter mode (CONF is internally pulled up, and no connection to this terminal is required for the TX mode of operation). When set to a low logic level, the device assumes the receiver mode. |
| PROG | 3 | I | Programming enable. When PROG is momentary held to a logic-high state, the device enters the programming mode. PROG is internally pulled down and debounced. |
| LED | 4 | O | Transmit, receive, and program indication. In the transmit mode, LED assumes a low state for the duration of the transmitted data time. In the program mode, LED assumes a low state until the device has successfully received and stored 40-bits of code from DIN/DOUT. In the receiver mode, LED assumes a low state for a duration valid code is received. LED is internally connected to a current source so that a LED indicator can be connected directly to this pin with no external current limiting resistor over the full range of operating voltage. |
| OSCC | 5 | I/O | Internal oscillator frequency control. A capacitor connected from OSCC to GND and a resistor connected from OSCR to OSCC determines the speed of the internal oscillator. The capacitor connected from OSCC to GND is optional. |
| OSCR | 6 | I/O | Internal oscillator frequency control. A resistor connected from OSCR to OSCC determines the speed of the internal oscillator (used in conjunction with an optional capacitor connected from OSCC to GND). |
| GND | 7 | | Analog and logic ground |
| VRC/TX1 | 8 | I/O | Channel 1 VRC (valid received code) output and channel 1 IX enable. In the receive mode, VCR/TX1 is an output and toggles to a logic-low state (for a nin 768 data clock cycles) when the device receives the correct 40-bits of security code and channel data (4 bits) matching channel 1. In the transmit mode, VRC/TX1 is an input used to enable transmission of channel-1. When VCR/TX1 is pulled to GND, the device continuously transmits the channel 1 code sequence stored in EEPROM memory from DIN/DOUT (up to 360 frames). The device will not transmit code again until VCR/TX1 is again pulled to GND. VRC/TX1 has an internal pull up resistor in both the transmitter and receiver modes and switch debouncing in the transmitter mode. |
| VRC/TX2 | 9 | I/O | Channel 2 VRC (valid received code) output and channel 2 TX enable. In the receive mode, VCR/TX2 is an output and toggles to a logic-low state (for a nin data 768 clock cycles) when the device receives the correct 40-bits of security code and channel data (4 bits) matching channel 2. In the transmit mode, VRC/TX2 is an input used to enable transmission of channel-2. When VCR/TX2 is pulled to GND, the device continuously transmits the channel 2 code sequence stored in EEPROM memory from DIN/DOUT (up to 360 frames). The device will not transmit code again until VCR/TX2 is again pulled to GND. VRC/TX2 has an internal pull up resistor in both the transmitter and receiver modes and switch debouncing in the transmitter mode. |
| VRC/TX3 | 10 | I/O | Channel 3 VRC (valid received code) output and channel 3 TX enable. In the receive mode, VCR/TX3 is an output and toggles to a logic-low state (for a min data 768 clock cycles) when the device receives the connect 40-bits of security code and channel data (4 bits) matching channel 3. In the transmit mode, VRC/TX3 is an input used to enable transmission of channel-3. When VCR/TX3 is pulled to GND, the device continuously transmits the channel 3 code sequence stored in EEPROM memory from DIN/DOUT (up to 360 frames). The device will not transmit code again until VCR/TX3 is again pulled to GND. VRC/TX3 has an internal pull up resistor in both the transmitter and receiver modes and switch debouncing in the transmitter mode. |
| VRC/TX4 | 11 | I/O | Channel 4 VRC (valid received code) output and channel 4 TX enable. In the receive mode, VCR/TX4 is an output and toggles to a logic-low state (for a min 768 data clock cycles) when the device receives the correct 40-bits of security code and channel data (4 bits) matching channel 4. In the transmit mode, VRC/TX4 is an input used to enable transmission of channel-4. When VCR/TX4 is pulled to GND, the device continuously transmits the channel 4 code sequence stored in EEPROM memory from DIN/DOUT (up to 360 frames). The device will not transmit code again until VCR/TX4 is again pulled to GND. VRC/TX4 has an internal pull up resistor in both the transmitter and receiver modes and switch debouncing in the transmitter mode. |
| TEST | 12 | | When TEST is held to Vcc, the device |

TABLE 1-continued

| PIN | N | I/O | DESCRIPTION |
|---|---|---|---|
| | | | enters a self-test mode. |
| VCC | 13 | I | +2.7 to +15 V (TRC1315 only) A 0.1 uF ceramic bypass capacitor is required from Vcc to Gnd. |
| VCC/CAP | 14 | I/O | +2.7 to +6 V (TRC1300 only) or 1 µF capacitor from CAP to ground (TRC1315 only) VCC/CAP also provides a regulated DC output in the TRC1315 device. A 0.1 uF ceramic bypass capacitor is required from VCC/CAP to Gnd for both the TRC1300 and TRC1315. |

Integrated circuit (IC) 20 has 8 main functional pins, named LED, CONF, PROG, DIN/DOUT and VRC/TX (4 times). In the embodiment described herein, some are always inputs (CONF, PROG), some are always outputs (LED) and some are either, depending on the mode of operation (DIN/DOUT, VRC/TX). All 8 pins are advantageously implemented as bi-directional I/O ports, mapped in the memory space of a micro-controller (later described with reference to FIG. 2). This makes it possible to define any pin as either an input or an output, depending on software. Input/output (I/O) interface circuitry (later described with reference to FIG. 2) is implemented as two 8-bit registers: a direction register which is used to define the data direction on the pin, and a data register, which is used to write data to when a pin is defined as an output.

In FIG. 1, configuration (CONF) pin 2 is used as an input only. When a logic high is detected on this pin by the micro-controller, the device enters the transmit mode. In that mode, IC 20 reads 4 bits of parallel data from the VRC/TX pins, encodes them into serial digital format 20 and outputs them onto the DIN/DOUT pin. When a logic low is detected on the CONF pin, IC enters the receive mode. In that mode, IC 20 reads serial data on the DIN/DOUT pin, decodes it, and if the correct security code is present, outputs the information onto the 4 VRC/TX pins.

In FIG. 1, data input data output (DIN/DOUT) pin 1 is used for the serial digital data stream. When the system is in transmit mode, this pin is configured as an output. A serial pattern representing identification code and data is output onto this pin by the micro-controller 40 of FIG. 2. When the system is in receive mode, this pin is used as an input. A low-level, potentially noisy signal from the receive section of the system (external to IC 20) is read from this pin into the analog processor 22 of FIG. 2. After analog processing and digital filtering, the original serial data stream is reproduced. Identification code and data are then recovered through a decoding process.

In FIG. 1, valid received code/transmit (VRC/TX) pins 8–11 are used for parallel digital information such as is normally the state of push-button switches that will be connected to the pins when configured as a transmitter. When IC 20 is in transmit mode, these pins are configured as inputs. They are debounced and read by micro-controller 40 of FIG. 2. The 4 bits of parallel data are then transmitted serially, together with an identification code (later explained). When IC 20 is in receive mode, these pins are used as outputs. The 4 bits of information that are extracted from the serial data stream by a decoding process are written to these pins. As a result, the parallel data outputs on the receiver side will match the parallel data inputs on the transmitter side (provided a valid identification code as explained later exists).

In FIG. 1, program (PROG) pin 3 is used as an input only. When a logic high is detected on this pin by the micro-controller of FIG. 2, the device enters the learn (program) mode. In that mode, IC 20 waits for successful reception of data from a transmitter. After the data is decoded, the identification code is extracted and stored in non-volatile memory 36 shown in FIG. 2. From that point on, that transmitter (that identification code) becomes "authorized" on that receiver.

Still with reference to FIG. 1 and PROG pin 3, the learn mode causes a non-volatile flag in non-volatile memory 36 of FIG. 2 to be set, which causes IC 20 to "remember" that it has been in this mode. If afterwards, the transmit mode is activated, the flag causes stored identification codes to be deleted (randomized) from memory. This advantageous feature, called "transmitter-lock", improves security. It makes it impossible to "eavesdrop" and learn an identification code from an authorized user while in learn mode, with the intent of reproducing it afterwards and gain unauthorized access.

In FIG. 1, LFD pin 4 is used as an output only. When a logic high is written to it by the micro-controller of FIG. 2, a regulated current is output. This current can drive an light emitting diode, LED, directly. As such LED pin 4 is used to indicate learn mode or successful completion of a self-test.

Turning now to FIG. 2, an architectural block diagram of IC 20 is illustrated. IC 20 includes an analog processor 22, a synchronizer/counter 24, a clock oscillator 26, a main processing unit (MPU) oscillator 27, a data flip-flop 28, a main processing unit (MPU) 30, a read only memory (ROM) 32, a random access memory (RAM) 34, a non-volatile electrically erasable programmable random access memory (EEPROM) 36, and input/output interface circuitry 38. A description of the circuit blocks of FIG. 2 follows.

In FIG. 2, analog processor block 22 processes the incoming serial data stream from DIN/DOUT pin 1. Its input consists of the raw, demodulated signal from an external radio-frequency (or infra-red) receive section. As such, it is only used in the receive mode. The input signal is normally weak (a few millivolts) and noisy. The DC level of the input signal is normally not very well defined. Analog processor 22 amplifies the AC (varying) portion of the signal and performs a limited amount of noise filtering on it. It eventually monitors the signal for transitions from a "low" state to a "high" state and generates a corresponding well-defined, digital output.

FIG. 3 is a drawing illustrating analog processor block 22. Analog processor 22 includes a number of high-pass filters 221, a first comparator 222, a low-pass filter 223 and a second comparator 224 with hysteresis. High-pass filters 221 are used to reject the (fixed) DC level of the input signal, while amplifying the AC portion. A total AC gain of about 100 is enough to boost milli-volt range signals to a level practical for further processing. High-pass filters 221 may be implemnted by switched-capacitor technology and the clock rate of filters 221 may be variable as set by clock oscillator 26, whose frequency is determined by an external capacitor and resistor, as explained with more particularity below. As a result, the filter cut-off frequency will automatically adjust to the (user-defined) sampling rate. For improved supply rejection performance (immunity to noise introduced by the digital portion of the IC), the high-pass filters are preferably implemented in fully-differential technology.

In FIG. 3, high-pass filters 221 are followed by a comparator 222, whose digital output is logic high when filter output 221 is negative and logic low when filter 221 output is positive. First comparator 221 is followed by a continuous-time low-pass filter 223 and a second comparator 224. Comparator 224 has a certain amount of input hysteresis to effectively reject short (high-frequency) digital noise spikes. The output of analog processor 22 is a clean digital data stream, which ideally should match the data stream generated by the transmitter IC.

Figure 3A:
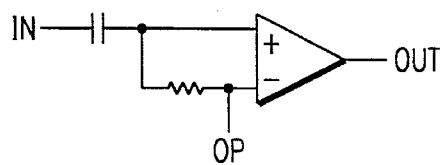
FIG. 3a is a schematic diagram of a first embodiment of high pass filter 221 of FIG. 2.

FIG. 3a is a first embodiment of a high pass filter 221 providing AC coupling. Compared with prior art FIGS. 14 and 15, one can verify that the traditional method corresponds to a DC-coupled system. If the comparator is modeled as a linear, high-gain amplifier (with gain A) and it is assumed that the low-pass filter is a first-order system, a simple formula can be written for the comparator output, Y, as a function of the input signal, X:

$$Y=A(X-X/(1+jf))=A\ X(1-1/(1+jf))$$

$$Y=A\ X(jf/(1+jf))$$

Where f is the first-order pole of the low-pass filter and j is the imaginary unit.

Inspection of the second formula reveals a high-pass filter characteristic. This means that the traditional circuit of prior art FIGS. 14 and 15 can be replaced by a high-pass filter configuration as shown in FIG. 3a, without functionality change. This high-pass filter approach has the following advantages:

1. It is AC-coupled, i.e. the DC level (operating point) of the incoming signal is irrelevant, because the signal is passed through a capacitor.
2. The operating point (OP) can be chosen arbitrarily, as long as it is within the input common-mode range of the amplifier.

While the first embodiment of high pass filter 221 of FIG. 3a is a significant improvement over prior art FIGS. 14 and 15, an offset problem may still exist. The sensitivity of the signal shaper is still limited by the comparator offset. In order to increase the sensitivity, one or more pre-amplifiers are needed. However, the amplifiers can all be AC-coupled in a fashion similar to the comparator as a comparator and an amplifier with differential input are very similar anyway. This scheme will solve the offset problem completely. The input-referred offset of one stage simply results in an operating point variation at the output, which is rejected by the high-pass (AC-coupled) characteristic of the next stage.

Figure 3B:
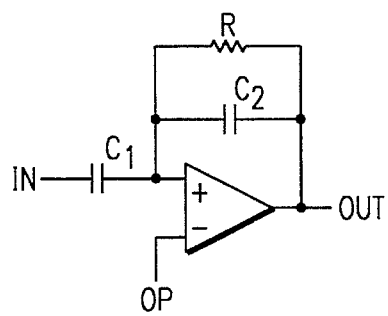
FIG. 3b is a schematic diagram of a second embodiment of high pass filter 221 of FIG. 2.

FIG. 3b shows a second embodiment of high pass filter 221 of FIG. 3 having continuous time stages illustrating a practical implementation of an AC-coupled gain stage. The amplifier is assumed to have very large ("infinite") gain. The closed-loop high-frequency gain is set by the ratio of C1 and C2. The DC gain is 0. The time constant (inverse of cut-off frequency) is set by the product of R and C2.

While providing a further improvement, the realization of FIG. 3b may be impractical for implementation within an integrated circuit, because of the very long time constants that are typically needed (millisecond range). In practical systems, the bit-rate is limited to a few kHz, and the time constant must typically be longer than one bit time, as shown above. Such long time constants cannot economically be realized with on-chip resistors and capacitors. Implementation with external capacitors and/or resistors is feasible, but puts more burden (and cost) on the final user.

Figure 3C:
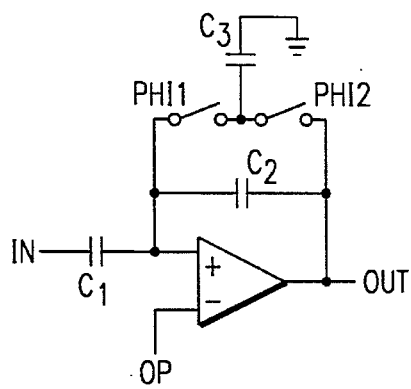
FIG. 3c is a schematic diagram of a third embodiment of high pass filter 221 of FIG. 2.

However, the as illustrated in the third embodiment of FIG. 3c, the resistor can be replaced by an equivalent switched-capacitor network, where according to the well-known formula:

$$Req=1/(C3\ fs)$$

Where fs is the switching frequency and PHI1 and PHI2 are non-overlapping clocks as explained with reference to FIGS. 4 and 5a.

Therefore, the cut-off frequency, fc for the high-pass filter is:

$$fc=(C3/C2)fs$$

The switched-capacitor approach works well as long as the switching frequency (which is normally also the sampling frequency for the incoming signal) is faster than the bit rate. The high pass filter 221 implementation of FIG. 3c has the following advantages:

1. Long time constants can be realized on-chip.
2. The system is still AC-coupled and self-biasing.
3. The cut-off frequency is set by a ratio of capacitors, which can be matched very well on an integrated circuit.
4. When the sampling rate, fs, is changed (normally beacuse of different expected bit-rate), the cut-off frequency, fc, changes proportionally. This simplifies the use of the signal shaper, since no new calculations or different external components are needed.

Figure 3D:
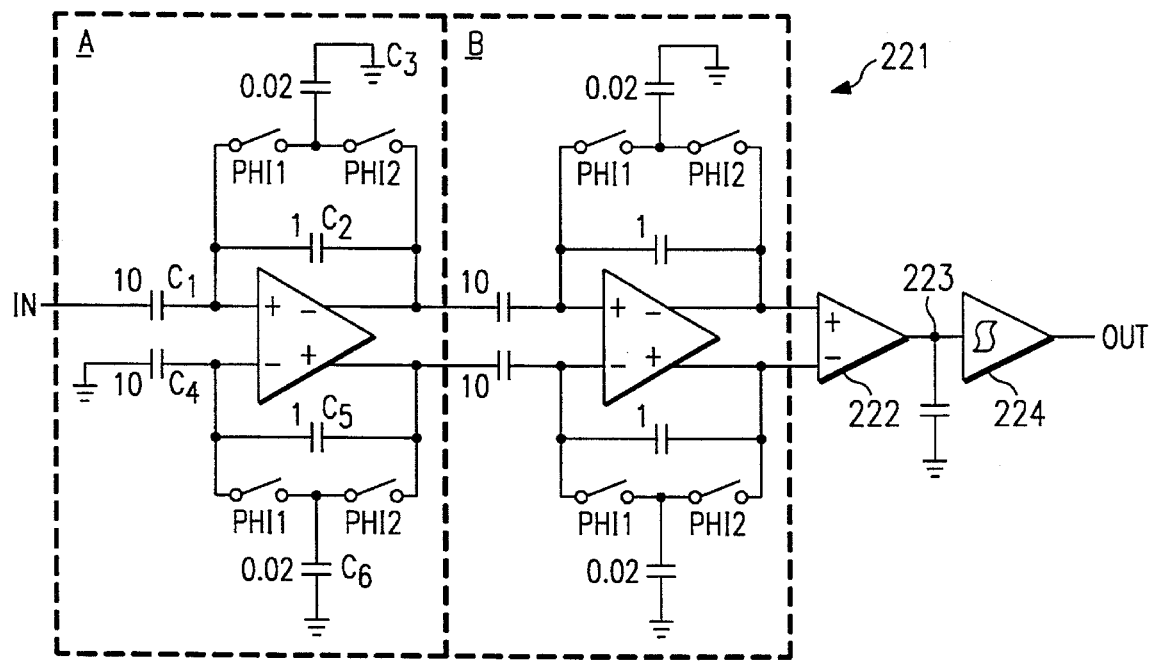
FIG. 3d is a schematic diagram of a preferred embodiment of high pass filter 221 of FIG. 2.

FIG. 3d shows the fully-differential architecture preferred embodiment of high pass filter 221. It consists of two similarly constructed gain stages A and B with a nominal gain of about 10 and time constants of about 50 sample periods (sampling at about 10× the expected bit rate is assumed). The second gain stage B is followed by the comparator 222. The gain stages are implemented in a balanced, fully-differential fashion. Such architecture tends to improve power supply rejection and immunity to parasitic effects. The amplifiers are designed in such a way that their common mode operating point is stabilized. Capacitor C1 is the input capacitor that couples the input signal into the amplifier. Filter 221 thus is fully differentiated as the input signal passes through a capacitor as it enters the gain stage. In the preferred embodiment, it is sized at about 10 picofarads. Capacitor C2 is connected in feedback fashion to set the gain. In the preferred embodiment, it is sized at about 1 picofarad. Capacitor C3 is connected on one side to a power supply of about 5 volts in the preferred embodiment. The other side of capacitor C3 is connected to switching signals PHI1 and PHI2. Capacitor C3, having a size of about 0.02 picofarads, sets the time constant and sets the operating point of the fully differentiated operational amplifier. One side of input capacitor C4 is connected to ground as is one side of capacitor C6. Capacitors C4, C5, and C6 are sized identically to capacitors C1, C2, and C3.

The comparator 222 thus has a differential input provided by gain stages A and B and single-ended output. It provides a first approximation of the incoming digital signal. Additional capacitance 223 is added at the output of comparator 222 in order to limit its high-frequency response. This limits the rate of change of the output signal. The schmitt-trigger 224 (buffer with hysteresis) restores the signal to full logic levels. And, the combination of comparator and schmitt trigger eliminates very fast noise spikes, which could otherwise be sampled and misinterpreted.

Continuing with FIG. 2, synchronizer/counter 24 samples the output from analog processor 22 (which output signal has digital levels but is still continuous-time) at the rate of the sample clock, which in this case is the output of clock oscillator 26. It filters the resulting discrete-time signal and then determines (counts) the relative high and low times of that signal to allow for decoding by main processing unit 30.

Figure 4:
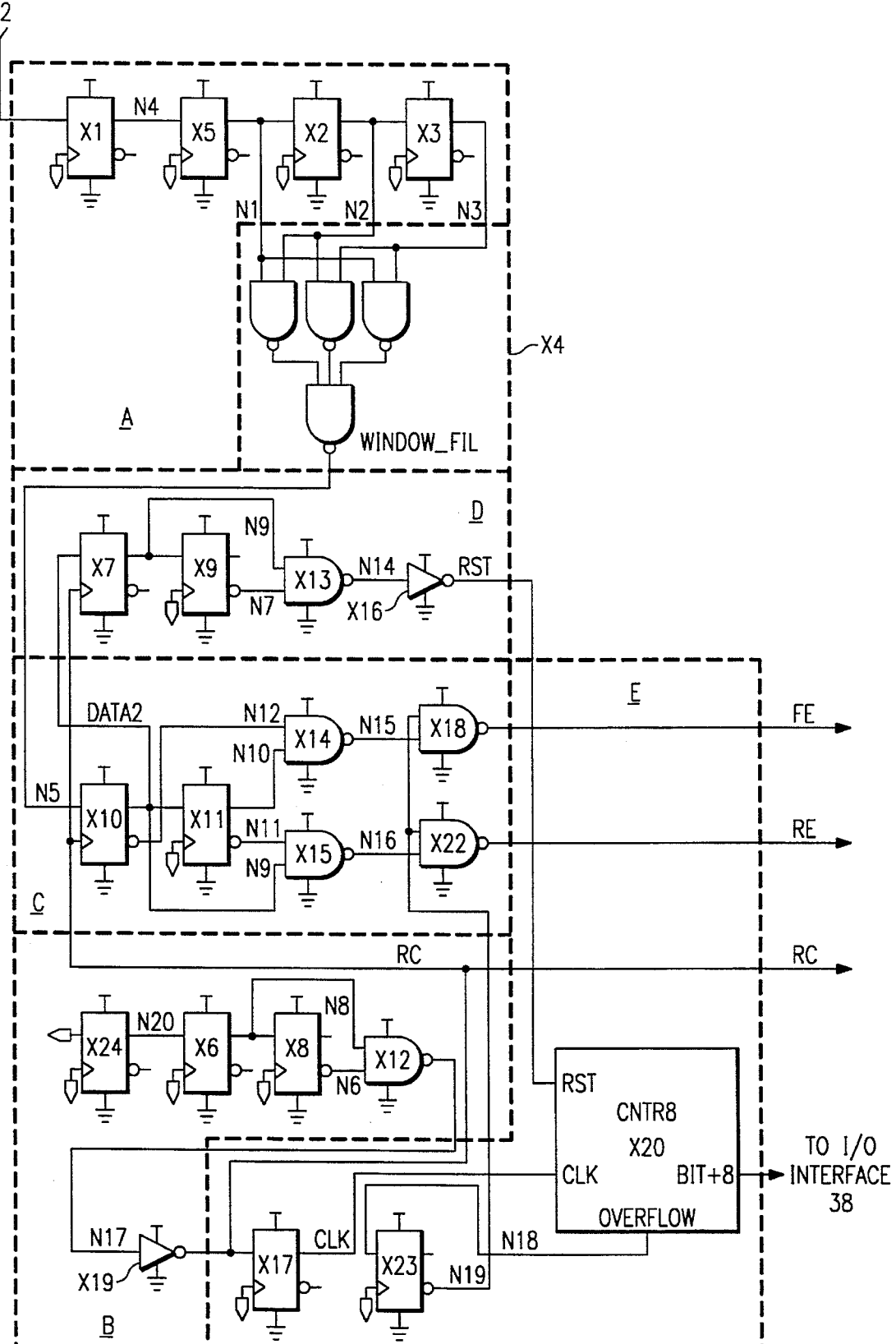
FIG. 4 is a schematic diagram of the synchronizer/counter 24 of FIG. 2.
Figure 5:
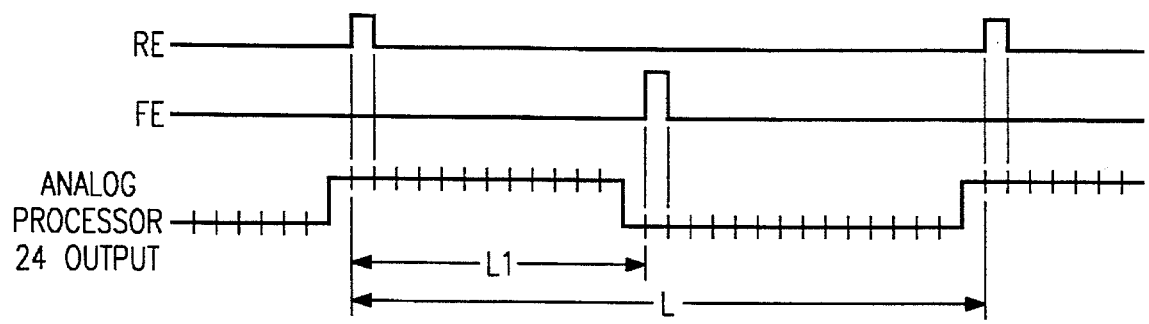
FIG. 5 is a timing diagram illustrating data sampling.

The filter used in this embodiment is a window filter X4 illustrated in FIG. 4 with a width of three and a simple majority voting scheme. This filter effectively eliminates any isolated (i.e. one sample long) noise spikes, should they have made it through analog processor 22. The counter portion of block 24 interfaces to MPU 30 by the signals rising edge "RE", falling edge "FE" and "RC" that are explained with more particularity with reference to FIGS. 4 and 5a. As shown in the schematic of FIG. 4, it consists of an 8-bit counter which is incremented on each sampling clock cycle, and some logic to detect a rising or a falling edge of the incoming serial data stream. While a more detailed explaination follows with reference to FIG. 4, in general, the counter is read by MPU 30 on each rising edge, and then reset. On each falling edge, the counter is read again (but not reset). This reading yields the "high" time of an incoming pulse, L1 as shown in FIG. 5. The next reading (on the next rising edge) yields the total pulse width, L. The values of L1 and L are used by a decoding algorithm to extract the transmitted data from the serial stream as will be later explained with reference to FIG. 9. A reset counter output feeds into I/O interface 38, which in turn is mapped in the memory address space. The signals that indicate rising or falling edges ("RE" and "FE" respectively) are connected directly into main processing unit 30.

Figure 5A:
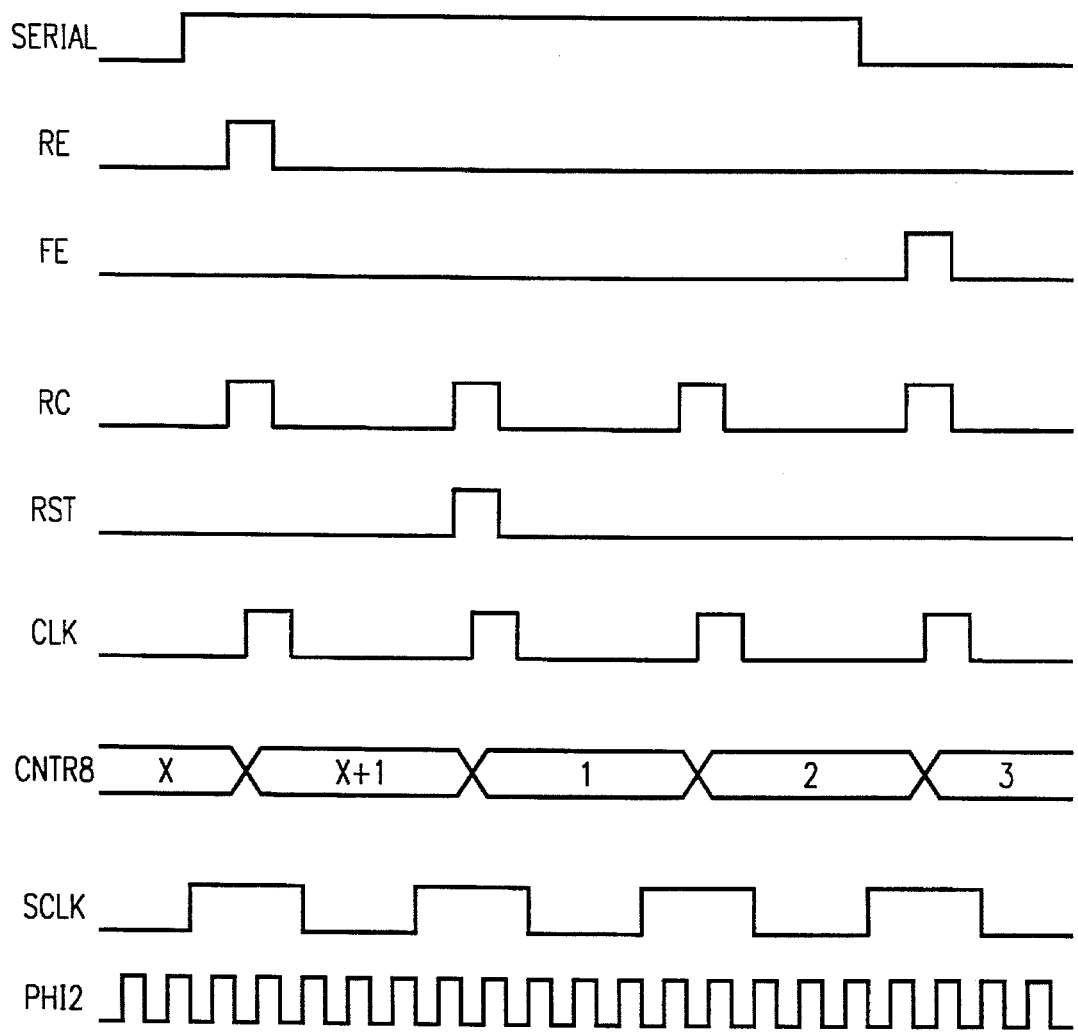
FIG. 5a is a timing diagram for the schematic of FIG. 4.

Attention is now directed to FIG. 4 which is an electrical schematic diagram of synchronizer counter 24 of FIG. 2 and to FIG. 5a which is a timing diagram illustrating the operation of FIG. 4. As will be described below, the system is designed to help a micro-controller or micro-processor (the "controller") decode a serial digital data stream like the one typically used in serial interfaces (e.g. RS-232 standard) or for remote control applications over an RF link. It measures the pulse widths of the logic high and the logic low parts of the incoming serial signal (SERIAL). It uses a binary counter, and signals to the controller when a rising or falling edge occurs (RE, FE).

The circuit of FIG. 4 uses two clocks to achieve synchronization. The first clock is the sample clock (SCLK) generated by clock oscillator 26 which sets the rate at which the serial data signal SERIAL is read. Each rising edge of SCLK results in a sample of SERIAL being taken. The second clock is the master clock generated by clock oscillator 27 used by controller 30 itself. Typically, this clock is much faster than SCLK (1.5 MHz vs. 50 kHz in the preferred embodiment), because the controller must be fast enough to process (i.e. decode) the serial information in a real-time fashion. At least two non-overlapping phases are needed; in this application, they are named PHI1 and PHI2.

All flip-flops in the electrical schematic of FIG. 4 are edge-triggered D types. The various circuit portions are next described.

Section A of FIG. 4 samples, synchronizes and filters the incoming signal. Flip-flop X1 is used to synchronyze the incoming data (on "SERIAL") to the sampling clock, SCLK. The three additional flip-flops, X5, X2, X3, form a 3-stage delay line, which in conjunction with decoding logic X4 forms a 3-stage majority voting scheme (also referred to as a window filter). Whenever two or more outputs from the delay line are high, the output of the filter is high. Whenever two or more outputs from the delay line are low, the filter output is low. This filter is used to ignore the effect of isolated noise spikes in the serial data stream, which may corrupt the logic value of one sample, without changing the sample immediately preceding or immediately following it. Since the incoming signal goes through two flip-flops (X1 and X5) before undergoing any modification, very reliable sampling and synchronization is obtained. This is because the probability of a meta-stability decreases rapidly with the number of consecutive flip-flops used for sampling. Node N5 carries the sampled and filtered input signal.

Section B of FIG. 4 detects rising edges of the sampling clock. Flip-flop X24 and X6 are used to sample SCLK, using the faster master clock PHI1. Since two consecutive flip-flops are used, the probability of meta-stability is drastically reduced and reliable synchronization is obtained. The purpose of re-sampling SCLK is to provide a signal, RC ("Rising Clock"), that indicates when a rising edge of SCLK occurs. This indication signal is synchronized to the master clock (PHI2), and is such that when a rising edge is detected, a pulse is generated that is exactly one period of PHI2 long. The edge-detect circuitry is implemented by flip-flop X8 and AND gate X12/X19. The output signal, RC, will be high if and only if the input to X8 is high and the output is low. This situation is equivalent to the present sampled value being high and the previous sampled value being low. The RC pulse always occurs between 1 and 2 PHI2 periods after the actual transition on SCLK. (The transition itself is asynchronous).

Section C of FIG. 4 detects rising and falling edges on the filtered version of SERIAL. The sampled and filtered input signal, N5, is synchronized to SCLK, but not to the master clock, PHI2. Therefore, a second synchronization is needed. Flip-flop X10 provides this synchronization. It is clocked by the RC signal (which is generated by section B and is synchronous to PHI2) and generates a PHI2-synchronous signal, DATA2. This resampling can be achieved by a single flip-flop, since meta-stability is not an issue. Indeed, N5 only changes on rising edges of SCLK, and RC is a pulse with rising edge occurring between 1 and 2 PHI2 periods after the rising edge of SCLK, which always results in ample set-up time for flip-flop X10.

Continuing with section C of FIG. 4, flip-flop X11, together with NAND gates X14 and X18, form a falling edge detector. X11 is clocked by PHI2; this is compatible with X10 being clocked by RC, since the two signals are synchronous, and a rising edge on PHI2 always occurs before a rising edge on RC. The output of this falling edge detector, FIE, is always exactly one period of PHI2 long. During normal operation, signal N19 (second input of X18) is high, which makes X18 operate as an inverter. One can verify that FE goes high when the input of X11 is low and the output is high (current value high, previous value low). Similarly, flip-flop X11, together with NAND gates X15 and X22, form a rising edge detector. The output signal, RE, is synchronous with PHI2 and always exactly one period long.

Section D of FIG. 4 generates counter reset signals. A counter needs to be reset after each detected rising edge (pulse on RE). The counter reset signal, RST, must occur one SCLK time after the RE pulse. This is accomplished by section D. The re-synchronized version of the serial signal, DATA2, is sampled by flip-flop X7, which is also clocked by RC (just like X10). This results in a delay of one period of RC. The delayed signal then goes to a rising edge detect circuit formed by flip-flop X9 (clocked by PHI2) and AND gate X13/X16. The resulting signal, RST is synchronous with PHI2 and exactly one period of PHI2 long. The RST pulse always occurs (approximately) one SCLK period after a RE pulse.

Section E of FIG. 4 measures pulse widths. As shown above, a short time after each rising edge of SCLC, an RC pulse is generated, which is synchronous with PHI2. This pulse is used to clock a counter, in this case an 8-bit binary type, called CNTR8. The result is that the counter value is incremented on each rising edge of SCLK. In other words: the counter continuously counts the number of samples taken of the SERIAL signal.

Fip-flop X17 of section E or FIG. 4 re-samples the RC signal, using PHI1. The result is that the counter clock is delayed by one clock phase with respect to PHI2. This is necessary in order to use a synchronous counter with reset. The RST signal coming out of section D is synchronous with PHI2 (but slightly delayed) and could not go into a counter which would itself be clocked by a signal that is slightly delayed with respect to PHI2. The additional one-phase delay on the counter clock ensures a proper set-up time for the RST signal. The design of the counter is such that when RST is high, and a rising edge occurs on the CLK input, the counter is reset to a numeric value of 1. This will result in a correct value being read for low and high times, as described below.

In the preferred embodiment, the counter is an 8-bit synchronous counter with reset and has an overflow output, which becomes logic high whenever the count reaches 255. This overflow is resynchronized to PHI2 and used to force FE and RE high when the counter exceeds its range. This is desirable in a case where SERIAL would be inactive (either low or high) for a long time, since in such case, no edges would be detected, and the controller could be stuck in a software loop waiting for RE or FE.

The overall method used to decode the incoming pulse-width modulated digital serial pulse stream, is next described as follows:

1. The serial data is sampled by SCLK and synchronized to PHI2, as described above.
2. A 0 to 1 (rising edge) on the serial data generates an RE signal.
3. One SCLK period later, the counter is reset to a value of 1.
4. A 1 to 0 (falling edge) on the serial data generates an FE signal.
5. The controller reacts by reading the value of the counter (within one SCLK time). This value expresses the high time of the current pulse (L1).
6. A 0 to 1 (rising edge) on the serial data generates an RE signal.
7. The controller reacts by reading the value of the counter (within one SCLK time). This value expresses the total time (pulse width) of the current pulse (L).
8. One SCLK period later, the counter is reset to a value of 1 Meanwhile, the controller analyzes the received pulse by comparing L1 and L. (Obviously, the low time could be calculated as L0=L–L1.)

Steps 4 through 8 are repeated continuously in order to decode the incoming serial data stream and extract the transmitted information real-time. The controller can efficiently do this, since it does not have to wait and analyze each incoming sample on SERIAL. Instead, the counting of pulses is accomplished by this decode circuit. The controller can focus on the decoding operation, by comparing relative high and low times.

This scheme makes it possible to execute a relatively sophisticated decoding algorithm on a simple controller, since the decode section takes away a great part of the processing burden. By making the controller wait for the RE and FE signals during the execution of the decoding algorithm, effective synchronization between the decode circuit and the controller is guaranteed, even if the controller does not have interrupt capabilities.

Referring back now to FIG. 2, clock oscillator 26 controls the rate of serial data transfer. In the transmit mode, it sets the bit rate of the transmitted serial data stream. In the receive mode, it sets the rate at which the incoming data stream is sampled. Oscillator 26 is of the relaxation type and uses one external resistor and one external transistor to set the frequency preferably between about 5 Khz and 50 Khz.

In FIG. 2, MPU oscillator 27 is fixed in frequency and controls the rate at which MPU 30 executes its program. Nominally, MPU 30 executes about 1 million instruction cycles per second. The output data (serial data stream) coming out of an IC 20 configured as a transmitter will be synchronized with the externally adjustable clock. MPU oscillator 27 produces the serial data at the required bit rate, based on the external clock. Information about the external clock is provided to the MPU 30 through the "RC" (rising clock edge) signal, which is generated by synchronization/counter block 24. However, the serial data from MPU 30 must still be synchronized with clock oscillator 26. Data flip-flop 28, clocked off the clock oscillator 26 and placed between I/O interface 38 and the serial output pins 8–11 achieves the final synchronization.

MPU 30 of FIG. 2 is illustrated in block diagram form in FIG. 6. As the discussion below reveals, the MPU core architecture 30 is extremely simple, resulting in minimal hardware, yet it allows the implementation of very powerful logic or arithmetic functions. It is very compact, occupying only about 1000–1500 square mils of semiconductor die area, excluding memory. It may be manufactured by existing 1 micron double-metal CMOS technology such as the PRISM process practiced by Texas Instruments Incorporated.

In FIG. 6, MPU 30 has an 8-bit wide data bus 301 and a 12-bit wide address bus 302. This makes it possible to access up to 4096 8-bit wide memory locations (ROM 32, RAM 34, EEPROM 36 or I/O 38) in a Von Neumann type architecture. Since MPU 30 is intended for small, embedded controller applications, such limited memory space is adequate. An advantage of a 12-bit wide address bus 302 is reduced hardware, compared to the more common case of a 16-bit wide address bus. All registers or logic blocks that operate on an address (program counter, incrementer, address register . . . ) are reduced in size.

The instruction set for MPU 30 of FIG. 6 is contained in Appendix 1 pages 1–6. The instruction set is very limited instruction set (22 instructions) and thus MPU 30 is of the reduced instruction set (RISC) type. The instructions perform the following functions:

Arithmetic and logic (7 instructions):
add, subtract, logic AND, logic OR, exclusive OR, shift right with carry, shift left with carry.
Mnemonics: ADD, SUB, AND, ORL, XOR, SHR, SHL
Register transfer (1 instruction):
Load B register from accumulator.
Mnemonic: LBA
Carry bit manipulation (2 instructions):
set carry and clear carry.
Mnemonics: STC, CLC
Jumps (3 instructions):
Absolute jump, absolute jump when carry set, absolute jump when carry not set.
Mnemonics: JMP, JPC, JNC
Memory access (5 instructions):
load accumulator immediate, load accumulator direct, store accumulator direct, load accumulator indirect, store accumulator indirect.
Mnemonics: LAV, LDA, STA, LAI, SAI
The instructions provided above are sufficient to perform any kind of logic or arithmetic task anticipated task in the field of remote access.

In addition, 4 instructions allow house-keeping tasks to be performed in a simple manner: stop (and go to low-power stand-by mode), wait for rising data edge, wait for falling data edge, wait for rising clock edge. Mnemonics: STP, WRE, WFE, WRC STP halts execution of the program and puts MPU 30 in a low-power stand-by mode, from which it can be pulled again by an external logic signal. The STP instruction causes a flip-flop to be set, which freezes the MPU clock in a given state, until the flip-flop is reset by an external event (in this application, activation of a switch by a user).

WRE, WFE and WRC are instructions very specific to this embodiment. They place MPU 30 in a wait state until a specific event occurs (rising or falling edge in this case). These instructions are only used to synchronize MPU 30 during the decoding of a serial data stream, which is based on an externally supplied, unrelated clock.

While subroutine calls and returns are not supported in the preferred embodiment, they may be easily added.

The instruction set above together with the reduced 12 bit side address bus 302, allows a lot of flexibility in the choice of op-codes (binary values corresponding to each instruction). In this particular embodiment, the op-codes (8 bits long) were chosen so that the instructions requiring a memory reference (an address) could be distinguished from each other using only 4 bits. The 4 other bits are used as the high part of the address. The low part of the address is then coded in the next byte. This scheme utilizes the available ROM storage space more efficiently than if an opcode were followed by two bytes for memory reference. The approach taken results in smaller programs that also execute faster when given a fixed MPU clock rate.

Referring again to FIG. 6, MPU 40 has a very limited set of registers. All transfers to and from the memory are performed through the 8-bit accumulator or A register 303. All single-operand arithmetic or logic functions (e.g. SHL) are performed on A. A single condition or carry bit (C) 304 is used for indication of logic or arithmetic overflow, negative numbers (two's complement operations), shift output bits etc. The state of this one bit is used as a qualifier for conditional jumps. Two-operand logic or arithmetic operations (e.g. add, AND) are performed between A register 303 and a second 8-bit register, B 305. B register 305 can only be written to through the LBA command.

In FIG. 6, an 8-bit instruction register (IR) 306 is used to download instructions from memory and decode them. This register can only be written to/from memory, during an instruction fetch cycle. A 4-bit address register high (ARH) 307 is used to temporarily store the high part of a memory address. The associated address register low (ARL) 308 is used to temporarily store the lower 8 bits of an address. The program counter (PC) 309 is 12 bits wide and points to the next byte to be downloaded from the memory during program execution.

In FIG. 6, a slave register (SVARS) 324 holds 2 state variables which are used for composite instructions. An Instruction Program Logic Array (IPLA) 313, which is clocked in nature, acts as the master register. A master register CARRY 325 and a slave register C1 326 exist for condition (carry) bit 304. General reset, set and clear capability are provided. An arithmetic logic unit register ALU1 327 is a slave register for A register 303 and B register 305 (through ALU 310, which is combinational). This allows the result of an ALU operation to be returned to A register 303. In this "circular" mode, register ALU1 327 reads data on a clock cycle phi3, while A reads data on a clock cycle phi1.

Still with reference to FIG. 6, a register LATCH3 328 delays the three lines from instruction register 306 that select the ALU operation (IR(3,5)). This is because the pipelining of MPU 30 is such that while an instruction is down-loaded from memory, the ALU 310 operation of the previous instruction may still be going on. A register INC1 329 is a slave register for program counter PC 309 (through INC 323, which is combinational). This allows the result of a program counter increment to be returned into PC 309. An indirect addressing block IND_ADD 318 is a logic block (not a register) used to force an indirect address on address bus (BBUS) 317, when enabled. The input to block IND_AD 318 comes from instruction register 306 with four bits IR (0,3). These 4 bits (part of an instruction) select one out of 16 possible locations in the main memory, to be used as an indirect address location for the LAI and SAI instructions. Each one of those 16 locations consists of 2 bytes (since they need to hold a 12-bit actual address). A RESET block 324 is used to force CBUS 319 to 0 (initial execution address) during initialization when a RESET signal is enabled. RESET block 324 is implemented as a bank of N-channel MOS transistors.

In FIG. 6, the 8-bit ALU 310 allows for 7 different arithmetic operations, involving either only A register 303, or A register 303 and B register 305, as well as the condition bit 311. The select input 312 of ALU 310 consists of 3 lines, which come straight from Instruction Register 306 and determine which operation needs to be performed. The Instruction Program Logic Array (IPLA) 313 is used to decode the current instruction in IR 306. Its inputs also include two lines that represent state variables, for the execution of composite instructions, three external lines for synchronization of the program flow (RE, FE, RC) and a reset line. The outputs of IPLA 313 control the whole data flow between registers and building block of MPU 30. IPLA 313 is implemented as an AND-OR PLA with dynamic (pre-charged) outputs. Appendix 2, pages 1–3 contains an extended listing of IPLA 313 while appendix 3 page 1 contains a simplified listing.

Still referring to FIG. 6, in addition to 8-bit data bus 301 and 12-bit address bus 301, there are three separate, internal buses. The first bus, ABUS 314, is 8 bits wide and allows the exchange of data between data bus 301, and registers 303, 305, and 306. It also allows the output from ALU 310 to be fed back to register 303. Downloading of data from data bus 301 to address registers 307 and 308 happens through ABUS 314 as well. ABUS 314 is isolated from data bus 301 through two buffer blocks: INBUF 315 and OUTBUF 316. This allows internal registers to have a smaller drive strength than if they had been connected directly to data bus 301. The second bus, BBUS 317 is 12 bits wide and interfaces directly to external address bus 302. BBUS 317 allows for the exchange of data between the output of ARH 307 and ARL 308 (collectively also called address register or AR), and an indirect address register IND_AD 318. In some cases, BBUS 317 can be shorted to the third bus, CBUS 319. CBUS 319 is also 12 bits wide and is primarily used to carry the incremented value of program counter PC 309 back into PC 309. In some cases, it can be shorted to BBUS 317 (when the switch BC_SW 320 is closed).

In FIG. 6, A register 303 and B register 305 are single-port registers with a separate output. Both registers can read from ABUS 314 or write to ABUS 314, depending on whether enable in ENIN 321 or enable out ENOUT 322 is activated. The output is always enabled, irrespective of ENIN or ENOUT. Instruction register IR 306 is similar to registers 303 and 305, except that the ENOUT control input is permanently disabled (there is no need for IR 306 to write to ABUS 314). Address registers ARH 307 and ARL 308 are dual-port registers. When signal ENIN 321 is enabled, data is loaded into the appropriate register from ABUS 314. When signal ENOUT 322 is enabled, the appropriate output is written onto BBUS 317. When ENOUT 322 is inactive, the output in question is high-impedance.

Continuing a discussion of FIG. 6, BC_SW 320 is implemented as a simple, bidirectional CMOS switch, which is closed when the EN signal is high. PC 309 is a single-port register with separate output, of the same type as A register 303 and B register 305. Incrementer INC 323 is a simple combinational logic block (incrementer built with half-adders and a ripple carry).

In FIG. 6, ALU 310 is a simple combinational logic block. The add and subtract functions are performed with full adders and a carry ripple scheme. Multiplexers are used to select between the outputs of add/subtract or the other functions (AND OR . . . ). IPLA 313 is implemented as an AND-OR array with pre-charge on clock phase phi3 and evaluation on clock phase phi1. The outputs from the array (the actual PLA) are gated using separate logic gates with either clock signals phi1 or phi2 to generate the control signals that are to be active on those respective phases only. Signals that are to be active on clock phase phi3 are lathed on phi2 and then gated with phi3. INC 323 is a simple combinational logic block (icrementer built with half-adders and a ripple carry).

In FIG. 6, IND_AD 318 calculates an indirect address from instruction register 316 bits IR(0,3) by shifting the 4 bits one position to the left (this yields bits 1 through 4 of BBUS 317), pulling bits 5 through 10 of ABUS 314 low and bit 11 high. Bit 0 is held high when the first address location is accessed, low for the second one. The result is that the indirect address locations are mapped at memory addresses 800 through 81F (hex), which in this implementation is RAM 34.

In FIG. 6, ALU1 327, INC1 329, SVARS 324, CARRY 325 and C1 326 are implemented as standard (two-port) latches. INBUF 315, OUTBUF 316 and ADBUF 330, although simple buffers only intended to boost drive capability, are actually implemented as full static registers (latches). This is to avoid the possibility of floating nodes during the power-down condition.

Discussion is now directed to the clocking scheme used for MPU 30 of FIG. 6. The clocking scheme relies on three non-overlapping clock phases: phi1, phi2 and phi3 produced by MPU clock 27. Phi1 is the evaluation phase for the (dynamic) IPLA 313. Also on phi1, addresses are updated and placed on the address bus 302. Phi2 is when all transfers to and from memory take place. The READ and WRITE signals are active during phi2. All inputs to IPLA 313 change state on phi2. Phi3 is the pre-charge phase of dynamic IPLA 313. Normally, no operations take place on phi3. One main exception is the case of an arithmetic or logic operation: the result is transferred from the ALU 310 output back to A register 303 during phi3. One advantage of the three-phase clocking scheme is that elementary instructions can be performed in one clock cycle (three phases). Also, the scheme is such that exactly one memory access occurs on each cycle. Since memory access is the slowest operation in this processor core, maximum speed advantage is gained. In addition, a three-phase scheme is ideally suited for access of most common memories (ROM 32, RAM 34 . . . ). During phi1, the memory address is presented. The whole phase allows the address buses and decoders within the memory to stabilize. Phi1 may also allow a pre-charge of memory bit lines. During phi2, the READ or WRITE signal is made active and the actual memory access occurs. Phase three ensures that address bus 302 remains stable while the READ or WRITE signal is removed. The scheme ensures that no glitching or spurious memory access can occur.

Returning now the discussion of FIG. 2, ROM 32 2 contains the executable program and the constant data used by MPU 30. The size of this program is about 1500 memory Bytes. RAM 34 of FIG. 2 holds temporary data generated during the execution of MPU 30's program. Examples are variables, counter values etc. RAM 34 contains about 32 memory bytes. EEPROM 36 of FIG. 2 holds non-volatile temporary data generated during execution of MPU 30's program. EEPROM 36 can be read directly by MPU 30. However, writing is a two-step operation. Volatile data (disappears when power is removed) is made permanent through the application of a high programming voltage (typically 16 V). This voltage is generated by an on-chip charge pump. EEPROM 36 contains about 24 EEPROM bytes and is primarily used to store 4 identification codes (5 bytes each), as well as various flags (e.g. for transmitter-lock).

MPU 30, ROM 32, RAM 34 and EEPROM 36 of FIG. 2 comprise a microcontroller 40 for IC 20 which advantageously provides the following functions:

Decoding of incoming serial data stream (receive and learn modes);

Comparison of incoming identification code with stored codes receive mode);

Activation of output pins (receive mode);

Polling and debouncing of parallel inputs (transmit mode);

Parallel to serial conversion (transmit mode);

Encoding of outgoing serial data stream (transmit mode);

Maintenance of EEPROM memory data;

Control and timing of charge pump for EEPROM memory;

Encryption and decryption, associated with a rolling code feature;

Various self-tests on ROM, RAM, EEPROM etc.; and

Various housekeeping tasks (activation and timing of LED . . . ).

Figure 7:
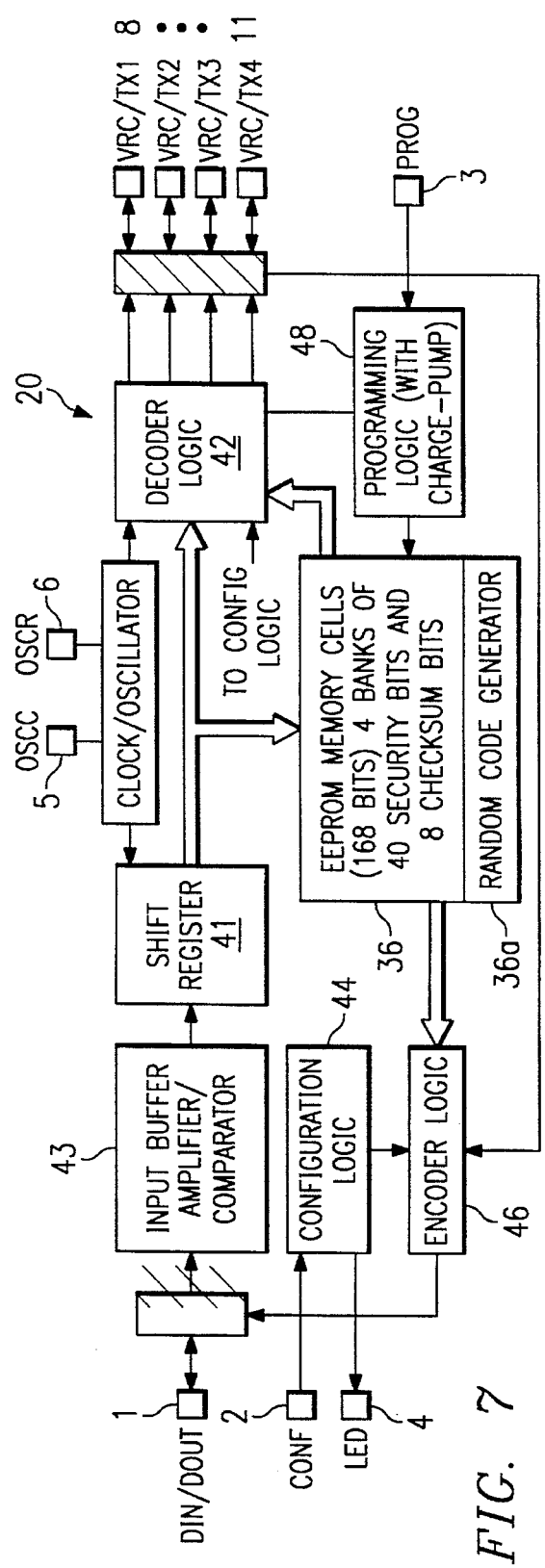
FIG. 7 is a functional block diagram of IC 20 of FIG. 2.

FIG. 7 illustrates a functional block diagram of IC 20. Functionally, a shift register 41 converts the incoming serial data bits to a parallel format. Decoder logic 42 is used in the receive mode to convert received symbols, later explained, to a 40 bit pattern that can be compared with four 40-bit codes stored in EEPROM 36. When a match is found with the stored code, the appropriate output pin (VRC/TX1–4) will be active for the entire time valid code is received. Configuration logic 44 configure IC 20 as either a transmitter or receiver. Both the encoder logic 46 and the decoder logic 42 as well as the bi-directional I/O ports are controlled by configuration logic 44. Encoder logic 46 uses parallel data from EEPROM 36 and encodes the selected security code for transmission to DIN/DOUT pin 1. The pre-code and security code symbol sequences are generated in encoder 46, as well as the channel identifier code. Transmission is enabled by a logic transition (to a low state) on one or more of the four input pins VRC/TX8–11. EEPROM 36 stores the four banks of 40 bit security codes (40 bits for each learned transmitter). EEPROM 36 functionally also contains random code generation logic 36a, which can be used to generate random code for IC 20 configured as a transmitter. Programming logic 48 generates the programming pulse (using an internal charge-pump) required to program EEPROM 36 after the code has been loaded into the memory cells (via a parallel bus) from the shift resister 41. Timing for the specific programming pulse ramping voltage is derived from an internal fixed clock.

Figure 8:
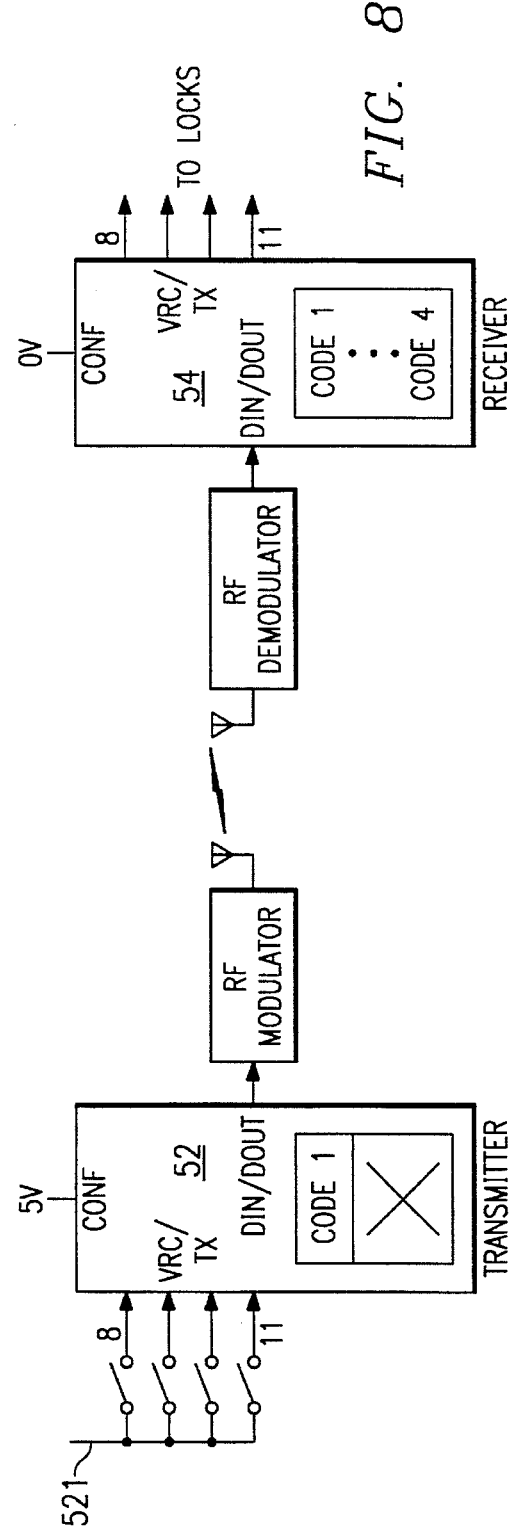
FIG. 8 is a diagram illustrating an IC 20 configured as a transmitter and another IC 20 configured as a receiver in a data transmission system.

FIG. 8 illustrates a data system 50 employing IC 20. IC 20 is configured as a transmitter 52 by connecting CONF pin 2 to Vcc while IC 20 is configured as a receiver 54 by connecting CONF pin 2 to ground. Data system 50 is exemplary of a garage door opening system. Transmitter 52 will be housed in a remote control situated in an automobile, for example, while receiver 54 will be connected to the garage door opener. Data system 50 is also exemplary of an automobile security system wherein transmitter 50 may be housed in a key and receiver 50 may be connected to automobile door locks. Switches 521 will connect to VRC/TX pins 8–11 of transmitter 52 and activate transmitter 52 when pressed while VRC/TX pins of receiver 54 will be connected to door locks, for example. Communication between transmitter 52 and receiver 54 is accomplished by connecting DIN/DOUT pins 1 to a radio frequency modulator and to a radio frequency demodulator.

In FIG. 8, pins 8–11 of transmitter 52 are inputs. Transmitter 52 reads those inputs and anchors the data into a serial format and brings it out to pin 1 where it is transmitted to receiver 54. Since CONF pin 2 of receiver 54 is grounded, receiver 54 is configured to receive the serial transmitted data. The serial transmitted data from transmitter 52 is input into receiver 54 through DIN/DOUT pin 1 of receiver 54. VRC/TX pins 8–11 of receiver 54 function as output pins. Hence, the same pins of IC 20 may be used as a transmitter or as a receiver by reversing the direction according to the configuration.

Figure 12:
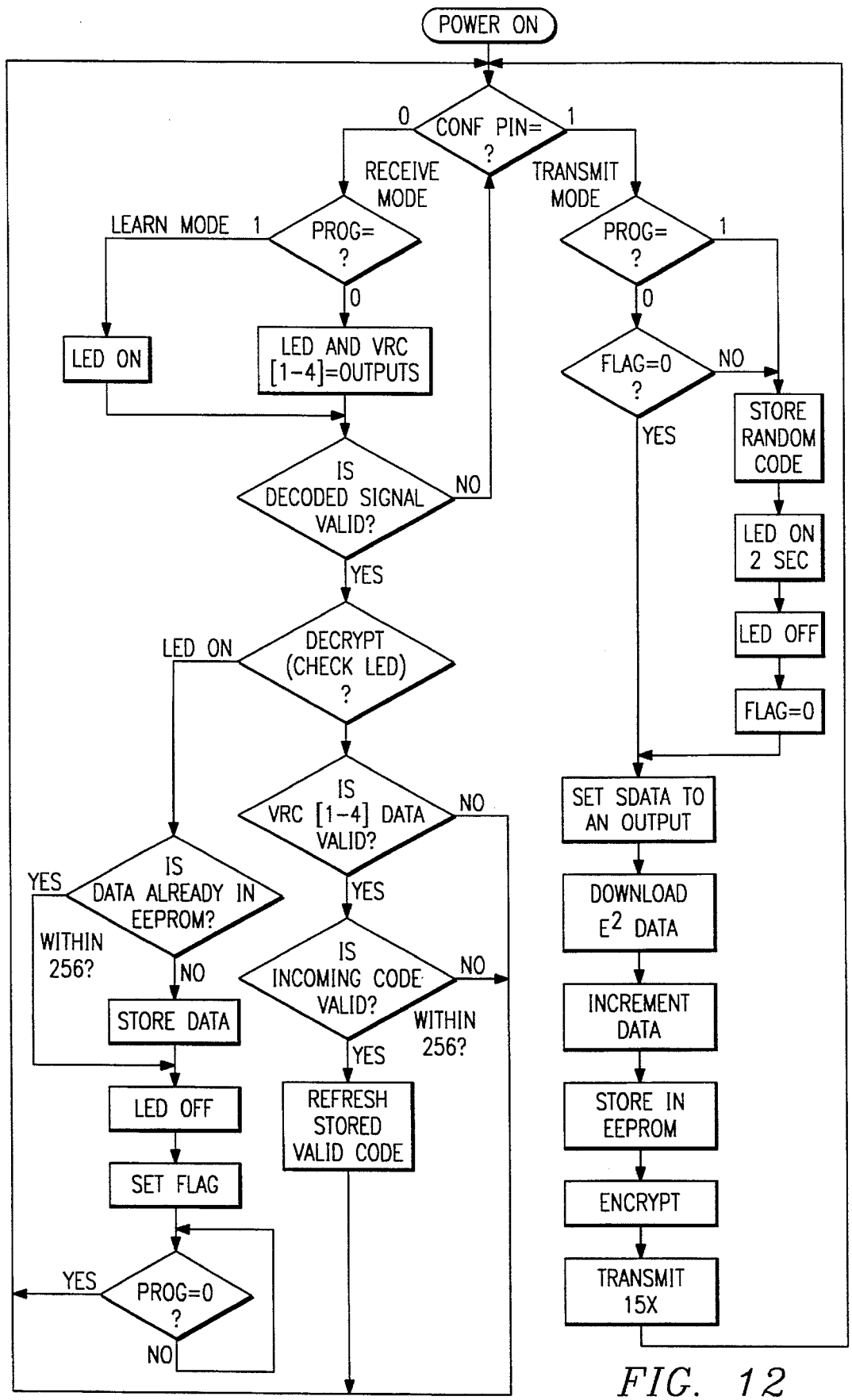
FIG. 12 is a flow chart illustrating transmitter lock.

Referring back to the functional diagram of FIG. 7, configuration logic 44 configure IC 20 as a receiver or a transmitter. In actuality, microcontroller 40 of FIG. 2 performs the configuration as illustrated in FIG. 12. Upon power up, a program embedded in ROM 32 causes microcontroller 40 to sense CONF pin 2. If a logic high is sensed, microcontroller 40 causes IC 20 to configure itself as a transmitter. If a logic low is sensed, microcontroller 40 causes IC 20 to configure itself as a receiver.

In FIG. 8, transmitter 52 has a unique identification code which is encoded into a serial digital data format when transmitter is activated. The digital signal is modulated onto a channel (usually radio frequency or infra-red). Receiver 54 demodulates the signal and decodes the serial digital information. The identification code is compared to the code(s) stored in receiver 54. If a match is found, access is granted. In IC 20, a code consists of 40 bits, which means that it can have one out of $2^{40}$ (1 trillion) possible values. A transmitter normally uses only one code, illustrated as code 1 in transmitter 52. A receiver has the option of learning several (4). This allows several separate transmitters to activate the same receiver.

Figure 9:
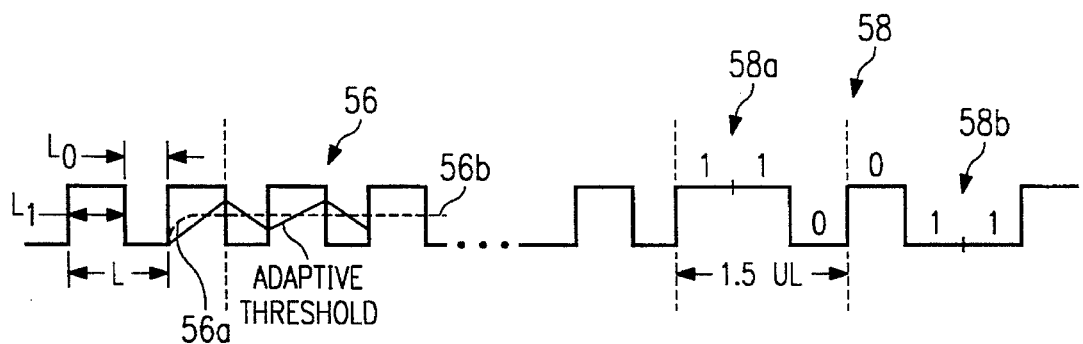
FIG. 9 is a timing diagram illustrating the transmission of a data stream by the transmitter of FIG. 8.
Figure 10:
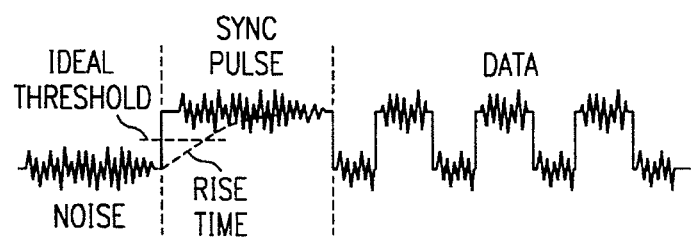
FIG. 10 is a prior art drawing illustrating transmission of a data stream.

Referring now to FIG. 9, the data format used by IC 20 is illustrated. The serial data transmitted by transmitter 52 of FIG. 8 consists of a synchronization sequence 56 (used by receiver 54 to recover timing information), followed by forty security bits and eight bits that represents the parallel data (four bits, transmitted twice in a row) which collectively are represented by reference numeral 58. In contrast with prior art techniques which use a long sync pulse as shown in FIG. 10, synchronization sequence 56 consists of twenty four data pulses with nominally 50% duty cycle (one time unit high and one time unit low, or 1010101010 . . . 10, for equal amounts of time). The forty eight bits carrying information are encoded as a 110 (logic "1") or 100 (logic "0"). Three data pulses are encoded into symbols for logic "1" and logic "0". Reference numeral 58a represents the encoded logic "1" and reference numeral 58b represents the encoded logic "0".

In FIG. 9, the data format generated by transmitter 52 is received by self adaptive amplifier/comparator filter 43 (FIG. 7) of receiver 54. Some noise usually precedes sync sequence 56. Amplifier/comparator 43 searches and synchronizes the data stream to extract the data back. Since sync sequence 56 is comprised of a number of data pulses, as opposed to one long pulse, the time constant 56a of filter 43 rises very quickly and goes to the average value of the incoming signal much faster than prior art techniques thus providing much more reliable detection. Since three time units are encoded data, the actual duty cycle is not 50% anymore, but rather 33% or 66%. The data signal thus has more AC components and less DC noise components which aids filter 43 to rise quickly and keep its adaptive threshold switching value 56b in about the middle of the signal.

Still referring to FIG. 9, receiver 54 must determine when sync pulse 56 is finished and when data sequence 58 begins. Microcontroller 40 accomplishes this by comparing the pulses. An algorithm within microcontroller 40 looks for each pulse. The sync pulse roughly should have a 50% duty cycle and the actual criterion used by microcontroller 40 is that sync pulse 56 would be between the range of ⅜ and ⅝. L represents one high/low transition pulse of sync pulse 56 comprised of high signal L1 and low signal L0. Microcontroller recognizes a valid sync pulse when ⅜ L<L1<⅝ L.

Still referring to FIG. 9, the symbol detection is slightly different. If microcontroller 40 detects eight consecutive pulses that have the same 50% duty cycle, then that length is considered as a unit length UL and everything else is referred to it. This means that a symbol 58a or 58b is 1.5 UL. Microcontroller 40 recognizes a valid symbol when ¹¹⁄₈ UL<L<¹³⁄₈ UL. So, the algorithm first looks for eight valid sync pulses, that is, at least eight pulses that have 50% duty cycle. After this, microcontroller 40 then looks to determine symbols by the formula ¹¹⁄₈ UL<L<¹³⁄₈ UL. Now a determination between the symbol logic "1" 58a and the symbol logic "0" 58b must be made. This is done by comparing the length of the symbols. The algorithm determines a logic "1" if L1 is longer than a L0. If L0 is longer than L1, a logic "0" exists. This can be further refined with additional constraints such that L1 needs to be between ⅜ and ⅝ and L0 needs to between ⅞ and ⁹⁄₈. Of course, the algorithm can be set to reverse the logical "0" and the logical "1" determination. So, every comparison is made on a ratio metric basis compared to total unit length UL to distinguish between sync and data. One of the advantages of using ratios ⅜ and ⅝ is that division by eight is very easy in binary. This allows the determination to be made real time efficiently at a very high rate. Since symbols have a different length (3 bits) than sync pulse (2 bits) they can be easily distinguished by the decoding algorithm. The difference between a logic 0 or a logic 1 can be determined by checking whether the duty cycle is more or less than 50%. The fact all pulses are close to symmetrical guarantees a frequency contents that helps the adaptive filter 43 threshold detector.

As mentioned above with reference to FIG. 8, transmitter 52 has one identification code stored in EEPROM 36 and receiver 54 may recognize 4 codes at any one time. EEPROM 36 contains four banks of forty bits that are used for security code and an additional eight bits used for check sum (error correcting). The total EEPROM memory is 168 bits plus a few extra bits bringing the total to 192 bits. When configured as a receiver, these banks store up to four learned codes; when configured as a transmitter, only the first bank of forty bits is used as a security code. Channel differentiation which is described by position of an additional four symbols actually sent twice in a row (to avoid corruption of data) sent to identify the channel(s) that have been activated. More than one channel can be activated at the same time. At the receiver, after the first forty bits are found to match one of the four forty bit codes stored in EEPROM 36, the last four symbols are decoded and used to enable the appropriate channel(s). If desired, a four bit binary decoder could be used at the receive to control up to 16 devices, one at a time, based on the four channel output.

Figure 11:
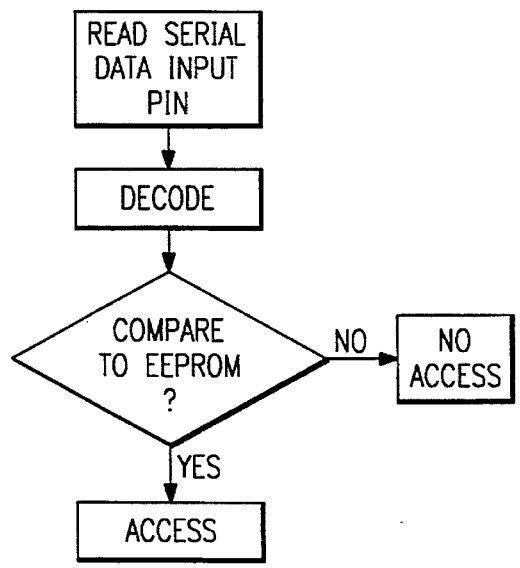
FIG. 11 is a flow chart illustrating receiver access grant.

Referring now to FIG. 11, when transmitter 52 sends out the serial data stream, receiver 54 receives the stream, decodes the stream and stores the forty bit identification code into RAM 34. MPU 30 compares the received forty bit identification code against the codes stored in EEPROM 36. If a match occurs, access is granted and the data bits are sent to output pin 1. If no match occurs, nothing is done. IC 20 advantageously has capability to learn the transmitted code of receiver 54 as is next explained.

The learn mode is accessed by placing a logic high on PROG pin 3. Microcontroller 40 then monitors DIN pin 1. When a valid serial input stream is received, it is decoded as explained above. The extracted identification code is then added to the list of authorized codes in EEPROM 36 of the receiver. The receiver can learn up to four transmitter codes. If programming is attempted for the fifth time, the receiver overwrites the first stored code.

Having an integrated circuit that can be used a transmitter, as a receiver, and has learn capability is a offers a powerful advantage. An additional function called transmitter lock ensures that any time after the learn mode is entered on IC 20, the transmit mode for that IC 20 cannot be activated without first erasing any memorized identification codes. This advantageously prevents a dishonest user from putting a receiver chip in learn mode, eavesdropping on someone else's data transmission and thereby learning their code, taking his chip out and sticking it into a transmitter board to obtain a "duplicate" unauthorized transmitter.

FIG. 12 is a device flow chart for IC 20 showing the transmitter lock feature. Whenever IC 20 is taken into the learn mode, a flag is set and permanently programmed into EEPROM 36. Upon power on reset, microcontroller 40 checks CONF pin to determine if IC 20 is to function as a transmitter or as a receiver. If it is to function as a transmitter, microcontroller 40 checks the flag status stored in EEPROM 36. If the flag is not set, then this indicates IC 20 has not previously been configured in learn mode and normal transmission occurs. If the flag has been set, the memorized identification codes are randomized (which has an effect similar to erasing).

With respect to FIGS. 12 and 8, to further avoid an unauthorized user learning transmitter 52's identification code, the code is changed (rolled) by microcontroller 40 according to a fixed sequence process, known only to transmitter 52 and receiver 54 but unknown to any potential eavesdropper. Before specifically detailing the method, general operation characteristics are provided.

Each time code is transmitted, the process adds one and then encrypts the code before transmission. Receiver 54 decodes this encrypted data back into the original code. This is done independently for each of the four channels, and for each of four learned transmitter codes. Each time the transmitter button is pressed (for any of the four channels), the rolling code method first increments the 40-bit security code and stores this in EEPROM 36. It then encrypts the incremented code and transmits it. The last encremented and nonencrypted code is always memorized in the transmitters nonvolatile EEPROM memory, so that the current position in the sequence is remembered even when the power is removed. As earlier indicated, each identification code consists of 40 bits, which yields a total of $2^{40}$ (1 trillion) possible values. The encrypting program is constructed to repeat the same code only after $2^{40}$ activations. Receiver 54 receives the transmittter's encrypted code. Next, it decrypts the code and stores it in RAM. A comparison is done between the code in RAM and the previous valid code stored in EEPROM. If the RAM code is within 256 of the EEPROM code, it is considered valid. The valid code replaces the previous code stored in EEPROM. The sequence will be repeated for the next transmitted valid code. If the code is not valid, it will not be stored in EEPROM, the channels will not be activated and access will not be granted. The receiver activates (grants access) whenever a valid code is received. This way, the transmitter can be activated up to 255 times without the receiver accepting the signal, and synchronization will not be lost. For example, in some cases, the transmitter could send code without the receiver decoding the signal (if the receiver is out of range, for example). This would normally cause the transmitter and receiver to fall out of sequence with each other. However, the receiver is advantageously allowed to activate on any of the next 256 expected codes from the transmitter based upon the currently stored 40-bit security code. In an extreme rare case, the transmitter could be activated more than 256 times without the receiver receiving a valid transmitted code. Re-synchronization can be accomplished by having the receiver simply "relearn" the transmitter code by using the above described Learn Mode.

When a valid code is received by receiver 54, the appropriate channel output is enabled. Immediately after this, receiver 54 stores this new received code in its EEPROM 36. A 'valid code' is defined as a code which was expected by the receiver based on the last received code (which is stored in EEPROM memory). Since the receiver only activates on the next expected code from the rolling code sequence, interception and subsequent retransmission of the same code will not allow activation of the receiver.

Attention is now directed to the rolling code program. The transmitted code is encrypted, and decrypted, using an exclusive OR, XOR, operation on the 40 bit code. The 40 bits are divided into 5 bytes of 8 bits each as shown in FIG. 13 where S4 is the most significant and S0 is the least significant. S4–S0 is the non-encrypted data. A 40 bit binary "up" counter (software implemented) is used as a primary number generator. The actual sequence is generated by encrypting the primary number. The encryption program operates on 5 bytes, primary words, as follows below. It generates encrypted binary numbers E0–E4 that are each 5 bytes long.

Let S0–S4=primary security code bytes 0–4.
Let E0–E4=encrypted code bytes 0–4.
S0–S4 cycles sequentially from binary 0 to $2^{40}-1$. The encrypted bytes E0–E4 are derived (from security code) using XOR operations. Likewise, the security code can be derived (from the encrypted data) using the reverse operation. Both operations are shown below:

Encryption method (used in transmitter):

| | | |
|---|---|---|
| E0 = S0 | simplified | E0 = S0 |
| E1 = S0 ⊕ S1 | | E1 = E0 ⊕ S1 |
| E2 = S0 ⊕ S1 ⊕ S2 | | E2 = E1 ⊕ S2 |
| E3 = S0 ⊕ S1 ⊕ S2 ⊕ S3 | | E3 = E2 ⊕ S3 |
| E4 = S0 ⊕ S1 ⊕ S2 ⊕ S3 ⊕ S4 | | E4 = E3 ⊕ S4 |

Decryption method (used in receiver):

S0=E0

S1=E0⊕E1

S2=E1⊕E2

S3=E2⊕E3

S4=E3⊕E4

The table in Appendix 5 illustrates the first ten encryption outputs of the total of $2^{40}$ or 1 trillion possible codes.

Appendix 6, pages 1-2 contain an encryption/decryption example. As the table and the appendix show, in every byte, at least one bit of the least significant byte changes. As the program executes, a lot of bits begin changing, as opposed to having a simple count. This advantageously makes it harder for an unauthorized individual to reverse the encryption as the bits appear to change randomly. Since the least significant byte is always changing, if it is exclusively OR'd with another number, the second least significant byte will also change by at least one bit and so on.

Appendix 7, pages 1-6 contains the program used in the rolling code method. In the transmit mode, the data (S0-S4) from EEPROM 36 is down-loaded to RAM 34. The data (S0-S4) is incremented by one. The incremented data (S0-S4) is stored back into EEPROM 36. The incremented data (S0-S4) in RAM 34 is encrypted which generates (E0-E4). In the receive mode, the encrypted data (E0-E4) is received and stored in the receiver RAM 34. The encrypted data (E0-E4) is decrypted back to its original form (S0-S4). The data in RAM 34 is compared to the data in EEPROM 36 by binary subtraction to look for a match. If the comparison shows the four most significant bytes stored in RAM minus the four most significant bytes stored in EEPROM equals zero, then the two are within 256 of each other. A match is when the data in the RAM and the data in the EEPROM are within 256 of each other. To look for a match $0 \leq$ (RAM data-EEPROM data$-1) \leq 255$ means MATCH. If a match is found the new data is stored in the EEPROM of the receiver. It will be compared against the next incoming code and the new code will be valid if it is within 256 of the stored data.

In an additional explanation of the rolling code method: if A represents the previously stored decrypted value (EEPROM) and B represents the decrypted version of the last received (RAM) code, then A is subtracted from B. Then, a binary 1 is subtracted from the result. If the 4 most significant bytes of the final result are equal to 0, the original numbers were between 1 and 256 apart and access is granted. The mathematical formulas are:

$$A < B \leq A+256 \qquad (1)$$

$$0 < B-A < 256 \qquad (2)$$

$$0 \leq B-A-1 < 255 \qquad (3)$$

If equation 3 is met, then the original numbers were between 1 and 256 and a match is found.

To program the receiver, the device is set for the learn mode. In the learn mode, the encrypted date E0-E4 is transmitted to the receiver. The receiver decodes the data (E0-E4) and decrypts it which produces (S0-S4). It stores the decrypted data (S0-S4) in RAM 34. The data (S0-S4) which is stored in the RAM is checked against the data stored in EEPROM 36. If no match is found or the two sets of data are not within 256 of each other, then the new data (S0-S4) is not stored. As the program shows, the program is relatively short; it takes very few bytes of ROM storage. And, it is very quick, taking only a couple of microseconds to calculate. The scheme is bidirectional, uses very little instructions, and uses the whole number, as opposed to a truncated number.

The rolling code algorithm described above can be generalized. Instead of incrementing the binary counter that generates the primary code in the transmitter, by 1 every time the transmitter is activated, it can be incremented by any number different from 0. If a prime number is chosen as the increment value, the primary sequence will only repeat after $2^N$ activations with N the number of bits in the counter. Prime increment value makes the primary sequence appear much more random than in the basic algorithm. The increment value can be negative as well as positive. The primary code is then encrypted as above.

On the receiver side, the encrypted code is first decrypted using the decryption algorithm described above. The difference is then calculated between this decrypted value and the last valid received and decrypted value. This difference is divided by the same increment that was used in the primary counter of the transmitter. If this number is grater than 0 but not greater than a pre-determined, positive limit (e.g. 256), the code is considered valid and access is granted.

Another refinement can be added to the basic encryption algorithm itself. After the basic encryption has been performed on the primary code, all bits can be permuted in a predetermined fashion, to make the result appear more random. On the receiver side, the inverse permutation of bits needs to be performed prior to application of the basic decryption algorithm. In effect, this corresponds to applying the bit permutation to the encrypted code.

Another variation consists of applying the bit permutation to the primary rather than the encrypted code. On the transmitter side, this means applying the permutation before the basic encryption algorithm. On the receiver side, this means applying the inverse bit permutation after the basic decryption algorithm.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. An integrated semiconductor circuit for decoding pulse width modulated serial data, comprising:

a shift register, clocked by a first clock signal, connected to the source of the serial digital data;

logic circuitry, connected to the shift register clocked by the first clock signal, to detect a rising edge of the received serial digital data and to detect a falling edge of the received serial digital data;

a counter, clocked by the first clock signal to determine the number of clock cycles of the first clock between rising and falling edges of the serial digital data, that is reset after each rising edge of the serial data;

a microcontroller, connected to the counter and clocked by a second clock signal, which reads the status of the counter each time a rising or a falling edge is detected on the received serial data; and a means for synchronizing the clocking of the counter and the detection of the rising edges and the falling edges to the second clock signal.

2. The integrated semiconductor circuit of claim 1 wherein the means for synchronizing is a clock signal used to clock the microcontroller.

3. The integrated semiconductor circuit of claim 2 further comprising a filter connected to the shift register and connected to the logic circuitry to eliminate noise.

\* \* \* \* \*